United States Patent
Yamazaki et al.

(10) Patent No.: US 8,390,019 B2
(45) Date of Patent: Mar. 5, 2013

(54) LIGHT EMITTING DEVICE, SEMICONDUCTOR DEVICE, AND METHOD OF FABRICATING THE DEVICES

(75) Inventors: Shunpei Yamazaki, Tokyo (JP); Toru Takayama, Kanagawa (JP); Junya Maruyama, Kanagawa (JP); Mayumi Mizukami, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 112 days.

(21) Appl. No.: 12/430,609

(22) Filed: Apr. 27, 2009

(65) Prior Publication Data

US 2009/0302339 A1 Dec. 10, 2009

Related U.S. Application Data

(60) Continuation of application No. 11/201,087, filed on Aug. 11, 2005, now Pat. No. 7,534,700, and a division of application No. 10/199,496, filed on Jul. 22, 2002, now Pat. No. 7,045,438.

(30) Foreign Application Priority Data

Jul. 27, 2001 (JP) ................... 2001-228353
Sep. 28, 2001 (JP) ................... 2001-300021

(51) Int. Cl.
*H01L 21/44* (2006.01)
(52) U.S. Cl. .................. 257/99; 257/E33.055
(58) Field of Classification Search ............ 257/98, 257/79, E33.068, 69, E33.055
See application file for complete search history.

(56) References Cited

U.S. PATENT DOCUMENTS

| | | | |
|---|---|---|---|
| 3,686,748 A * | 8/1972 | Engeler et al. ............ 438/122 |
| 5,206,749 A | 4/1993 | Zavracky | |
| 5,258,325 A | 11/1993 | Spitzer | |
| 5,313,076 A | 5/1994 | Yamazaki et al. | |
| 5,317,236 A | 5/1994 | Zavracky | |
| 5,341,015 A | 8/1994 | Kohno | |
| 5,376,561 A | 12/1994 | Vu | |

(Continued)

FOREIGN PATENT DOCUMENTS

| CN | 1312590 | 9/2001 |
|---|---|---|
| CN | 1332471 | 1/2002 |

(Continued)

OTHER PUBLICATIONS

Kreith et al., "Heat and Mass Transfer" (2000). The CRC Handbook of Thermal Engineering. Ed. Frank Kreith. Boca Raton: CRC Press LLC, 2000. pp. 3-1-3-47.*

(Continued)

*Primary Examiner* — Thomas L Dickey
*Assistant Examiner* — Nikolay Yushin
(74) *Attorney, Agent, or Firm* — Fish & Richardson P.C.

(57) ABSTRACT

A semiconductor device in which degradation due to permeation of water and oxygen can be limited, e.g., a light emitting device having an organic light emitting device (OLED) formed on a plastic substrate, and a liquid crystal display using a plastic substrate. A layer to be debonded, containing elements, is formed on a substrate, bonded to a supporting member, and debonded from the substrate. A thin film is thereafter formed on the debonded layer. The debonded layer with the thin film is adhered to a transfer member. Cracks caused in the debonded layer at the time of debonding are thereby repaired. As the thin film in contact with the debonded layer, a film having thermal conductivity, e.g., film of aluminum nitride or aluminum nitroxide is used. This film dissipates heat from the elements and has the effect of preventing deformation and change in quality of the transfer member, e.g., a plastic substrate.

42 Claims, 17 Drawing Sheets

U.S. PATENT DOCUMENTS

| | | | |
|---|---|---|---|
| 5,397,713 | A | 3/1995 | Hamamoto |
| 5,583,369 | A | 12/1996 | Yamazaki et al. |
| 5,654,811 | A | 8/1997 | Spitzer |
| 5,656,862 | A | 8/1997 | Papathomas |
| 5,674,304 | A | 10/1997 | Fukada |
| 5,696,386 | A | 12/1997 | Yamazaki |
| 5,757,456 | A | 5/1998 | Yamazaki |
| 5,781,164 | A | 7/1998 | Jacobsen |
| 5,807,440 | A | 9/1998 | Kubota |
| 5,821,138 | A | 10/1998 | Yamazaki |
| 5,851,862 | A * | 12/1998 | Ohtani et al. .................. 438/166 |
| 5,879,741 | A | 3/1999 | Itoh |
| 5,929,961 | A | 7/1999 | Nishi |
| 5,946,561 | A | 8/1999 | Yamazaki et al. |
| 6,033,974 | A | 3/2000 | Henley |
| 6,043,800 | A | 3/2000 | Spitzer |
| 6,059,913 | A | 5/2000 | Asmussen |
| 6,100,166 | A | 8/2000 | Sakaguchi |
| 6,118,502 | A | 9/2000 | Yamazaki |
| 6,127,199 | A | 10/2000 | Inoue |
| 6,221,738 | B1 | 4/2001 | Sakaguchi |
| 6,238,754 | B1 * | 5/2001 | Shohara et al. .................. 428/1.5 |
| 6,261,634 | B1 | 7/2001 | Itoh |
| 6,268,631 | B1 * | 7/2001 | Fukada et al. .................. 257/347 |
| 6,268,695 | B1 | 7/2001 | Affinito |
| 6,271,066 | B1 | 8/2001 | Yamazaki et al. |
| 6,310,362 | B1 | 10/2001 | Takemura |
| 6,320,640 | B2 | 11/2001 | Nishi |
| 6,358,766 | B1 | 3/2002 | Kasahara |
| 6,362,866 | B1 | 3/2002 | Yamazaki |
| 6,372,608 | B1 | 4/2002 | Shimoda |
| 6,376,333 | B1 | 4/2002 | Yamazaki |
| 6,423,614 | B1 | 7/2002 | Doyle |
| 6,448,152 | B1 | 9/2002 | Henley |
| 6,486,041 | B2 | 11/2002 | Henley |
| 6,492,026 | B1 | 12/2002 | Graff |
| 6,492,659 | B1 | 12/2002 | Yamazaki et al. |
| 6,521,511 | B1 * | 2/2003 | Inoue et al. .................. 438/458 |
| 6,544,430 | B2 | 4/2003 | McCormack |
| 6,562,672 | B2 | 5/2003 | Yamazaki et al. |
| 6,653,657 | B2 | 11/2003 | Kawasaki et al. |
| 6,664,169 | B1 | 12/2003 | Iwasaki |
| 6,682,990 | B1 | 1/2004 | Iwane |
| 6,689,492 | B1 | 2/2004 | Yamazaki et al. |
| 6,737,285 | B2 | 5/2004 | Iketani |
| 6,762,081 | B2 | 7/2004 | Yamazaki et al. |
| 6,774,010 | B2 | 8/2004 | Chu |
| 6,781,152 | B2 | 8/2004 | Yamazaki |
| 6,784,113 | B2 | 8/2004 | Hembree |
| 6,790,747 | B2 | 9/2004 | Henley |
| 6,802,926 | B2 | 10/2004 | Mizutani |
| 6,815,240 | B2 | 11/2004 | Hayashi |
| 6,847,097 | B2 | 1/2005 | Fukada et al. |
| 6,875,671 | B2 | 4/2005 | Faris |
| 6,936,846 | B2 | 8/2005 | Koyama et al. |
| 6,964,890 | B1 | 11/2005 | Yamazaki et al. |
| 6,998,282 | B1 | 2/2006 | Yamazaki et al. |
| 7,045,438 | B2 | 5/2006 | Yamazaki |
| 7,067,392 | B2 | 6/2006 | Yamazaki et al. |
| 7,067,926 | B2 | 6/2006 | Yamazaki et al. |
| 7,147,530 | B2 | 12/2006 | Yamazaki et al. |
| 7,361,519 | B2 | 4/2008 | Yamazaki et al. |
| 7,375,782 | B2 | 5/2008 | Yamazaki et al. |
| 7,425,931 | B1 | 9/2008 | Yamazaki et al. |
| 7,564,057 | B1 | 7/2009 | Yamazaki et al. |
| 7,825,588 | B2 | 11/2010 | Yamazaki et al. |
| 2001/0002703 | A1 * | 6/2001 | Koyama .......................... 257/40 |
| 2001/0022362 | A1 | 9/2001 | Hayashi |
| 2001/0040645 | A1 | 11/2001 | Yamazaki |
| 2002/0004250 | A1 | 1/2002 | Iketani |
| 2002/0004292 | A1 | 1/2002 | Yamazaki |
| 2002/0048864 | A1 | 4/2002 | Yamazaki |
| 2003/0032210 | A1 | 2/2003 | Takayama |
| 2003/0047280 | A1 | 3/2003 | Takayama |
| 2003/0064569 | A1 | 4/2003 | Takayama |
| 2003/0082889 | A1 | 5/2003 | Maruyama |
| 2003/0219935 | A1 * | 11/2003 | Miyairi et al. .................. 438/166 |
| 2004/0145018 | A1 * | 7/2004 | Inoue et al. .................... 257/347 |
| 2005/0017255 | A1 | 1/2005 | Yamazaki |
| 2008/0309585 | A1 | 12/2008 | Yamazaki et al. |
| 2011/0042679 | A1 | 2/2011 | Yamazaki et al. |

FOREIGN PATENT DOCUMENTS

| | | |
|---|---|---|
| EP | 1 122 794 | 8/2001 |
| JP | 59-215694 A | 12/1984 |
| JP | 01-309356 A | 12/1989 |
| JP | 05-347186 | 12/1993 |
| JP | 06-296023 A | 10/1994 |
| JP | 08-288068 A | 11/1996 |
| JP | 10-125929 | 5/1998 |
| JP | 10-125930 | 5/1998 |
| JP | 10-125931 | 5/1998 |
| JP | 11-300977 A | 11/1999 |
| JP | 2001-052873 A | 2/2001 |
| JP | 2001-060697 A | 3/2001 |
| JP | 2001-068678 A | 3/2001 |
| JP | 2001-085154 | 3/2001 |
| JP | 2001-189460 | 7/2001 |
| JP | 2001-267578 | 9/2001 |
| JP | 3238223 | 12/2001 |
| WO | WO 92/12453 | 7/1992 |
| WO | WO98/15973 * | 4/1998 |
| WO | WO99/01899 * | 10/1999 |

OTHER PUBLICATIONS

Toru Takayama et al.; "A CPU on a Plastic Film Substrate"; *2004 Symposium on VLSI Technology Digest of Technical Papers*; pp. 230-231; 2004.

* cited by examiner

Fig. 1A condition after elements are formed
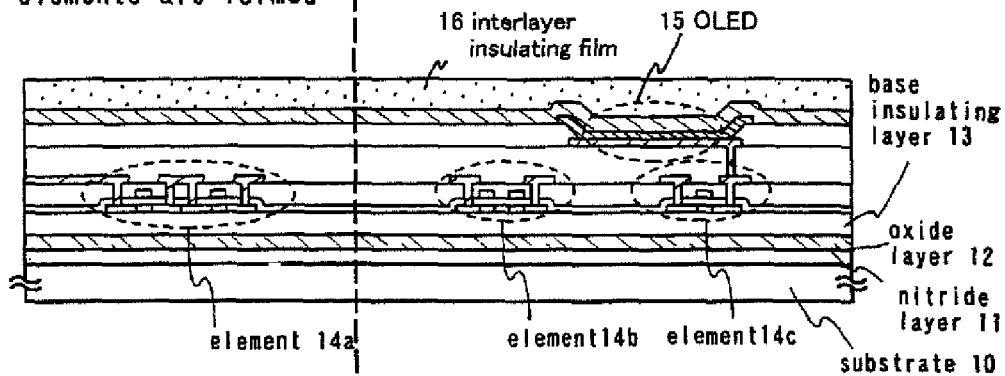
Fig. 1B formation of a film having thermal conductivity
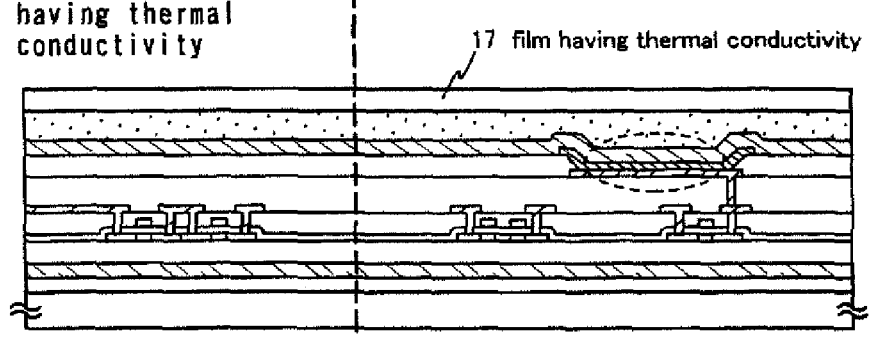
Fig. 1C condition after a supporting member is adhered
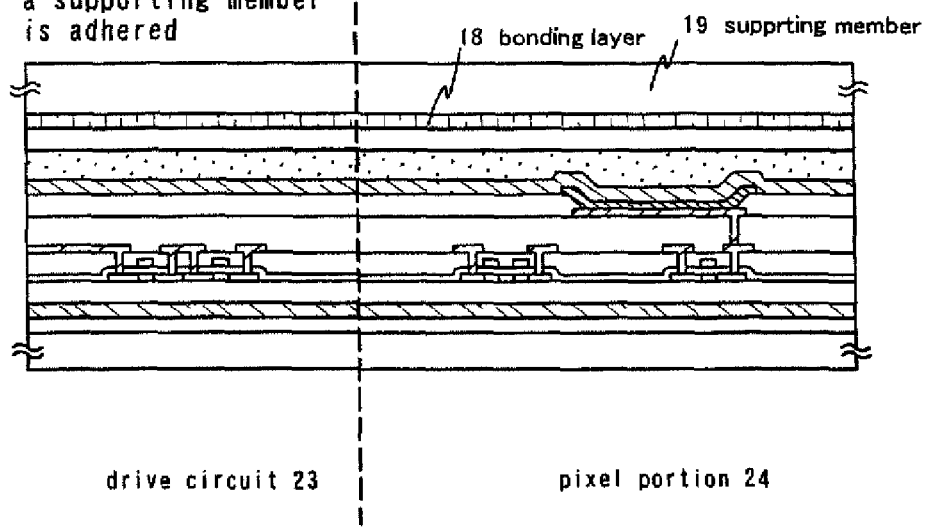

Fig. 2A condition after substrate is debonded
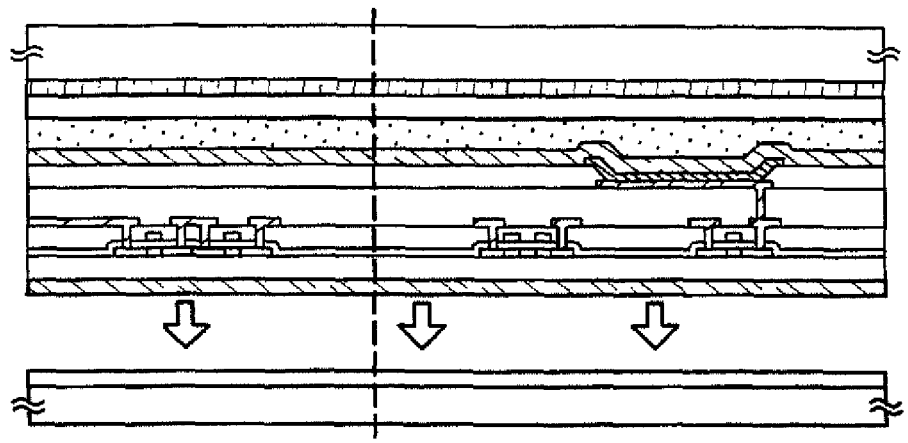
Fig. 2B formation of a film having thermal conductivity
20 film having thermal conductivity
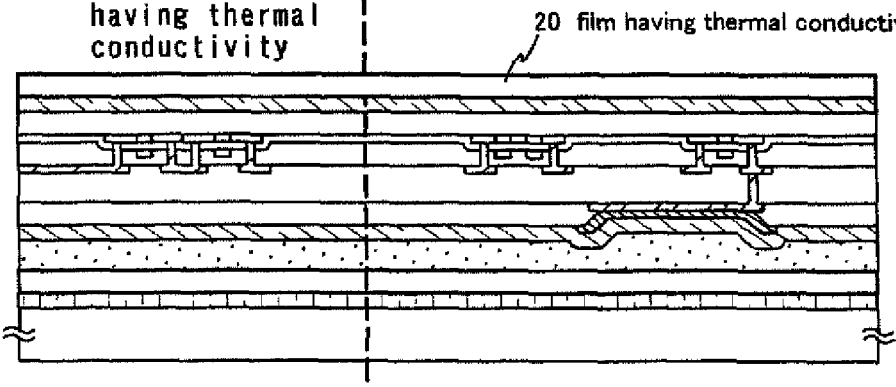
Fig. 2C condition after a transfer member is adhered
transfer member 22 (film substrate)
bonding layer 21
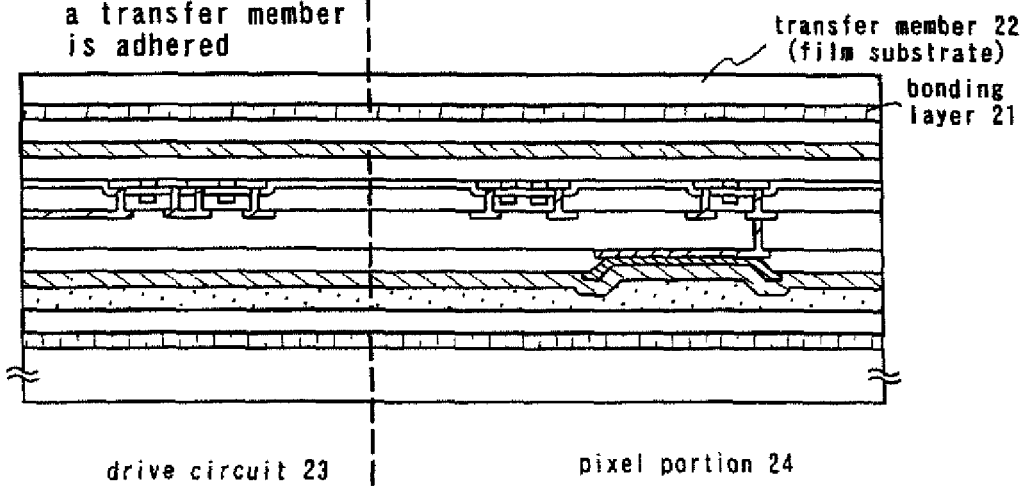
drive circuit 23 | pixel portion 24 p-channel TFT    n-channel TFT

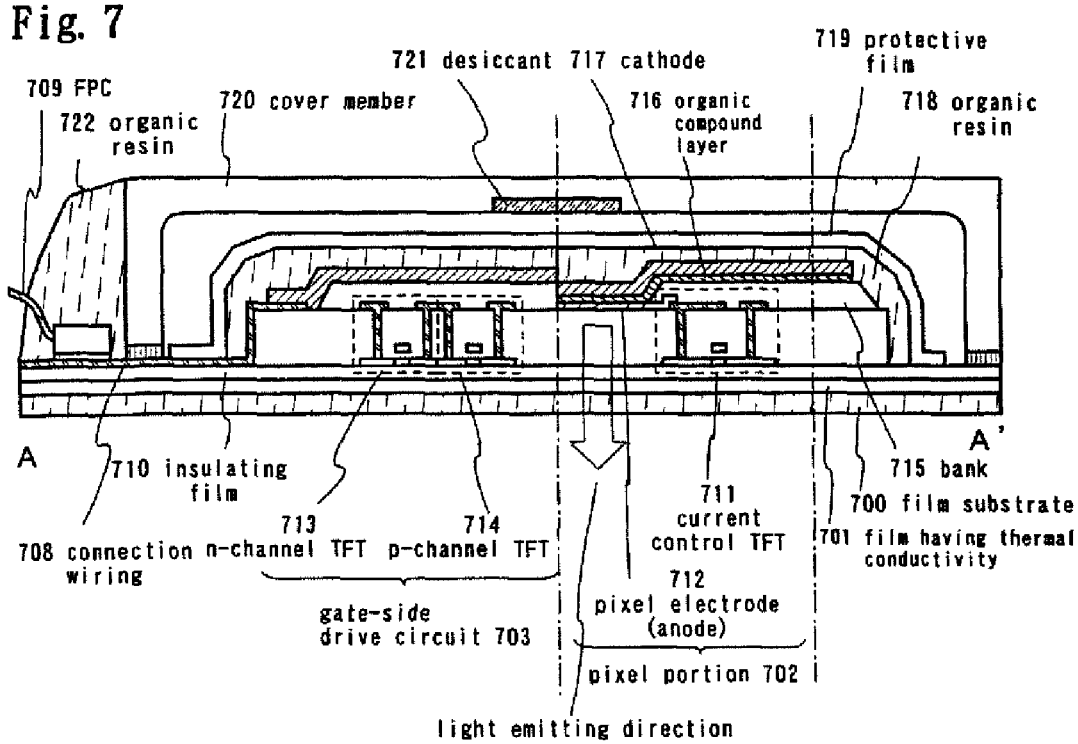
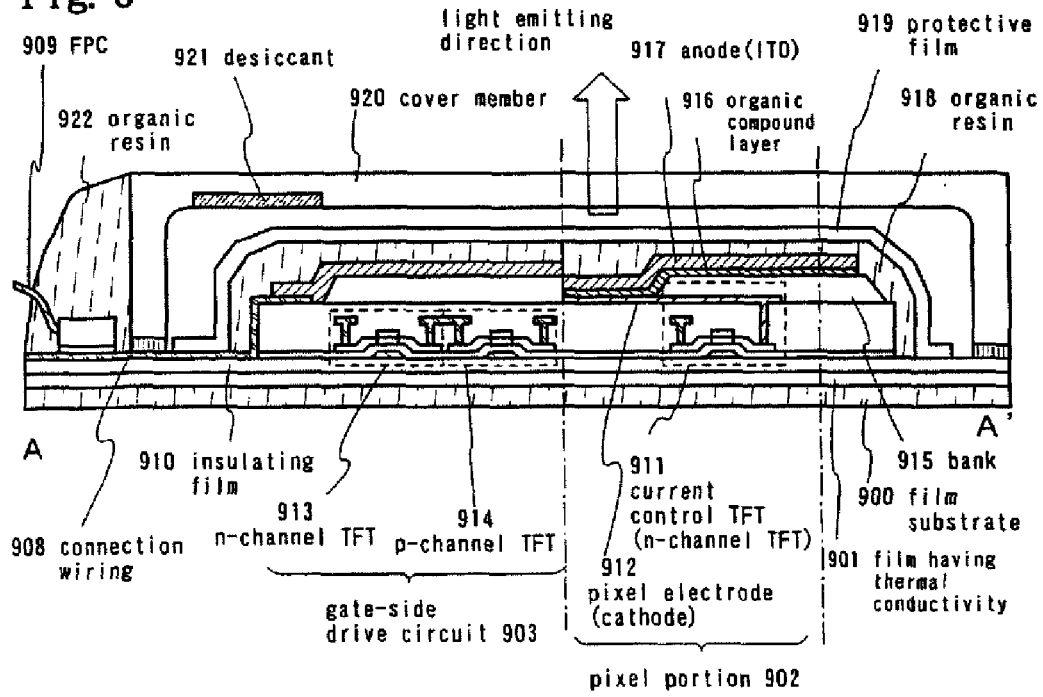

Fig. 10A condition after active matrix substrate is prepared
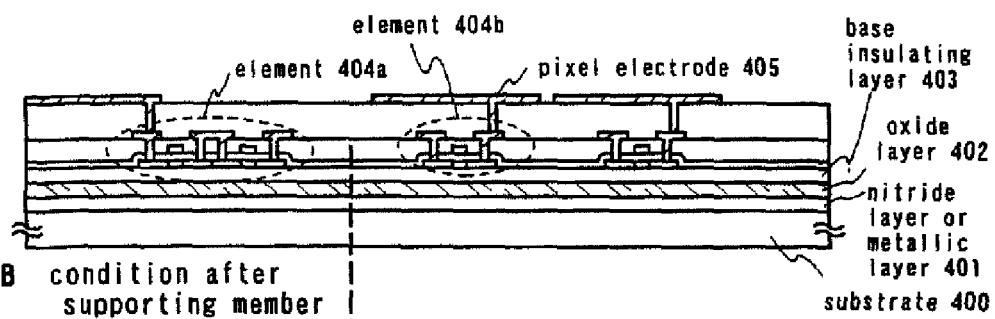
Fig. 10B condition after supporting member is adhered and liquid crystal material is implanted
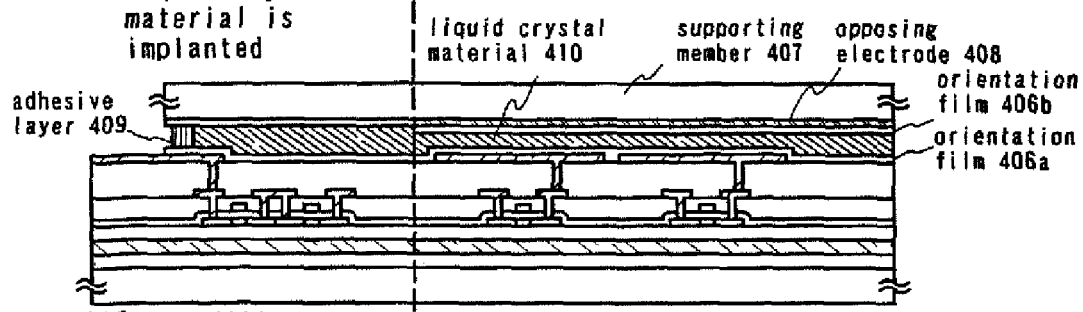
Fig. 10C condition after a substrate is debonded
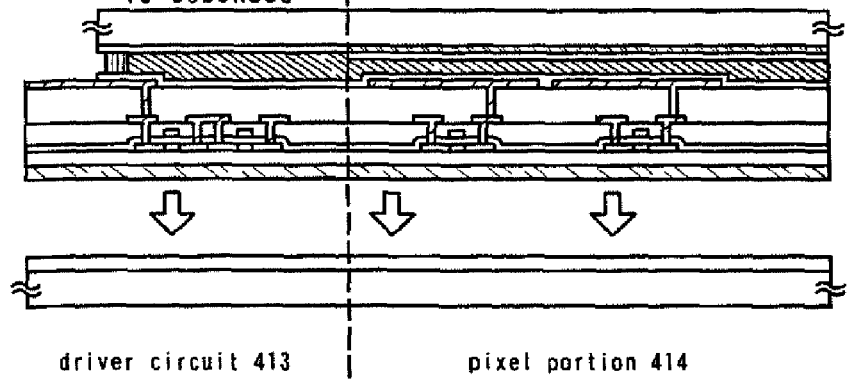
driver circuit 413 | pixel portion 414

Fig. 11A formation of a film having thermal conductivity
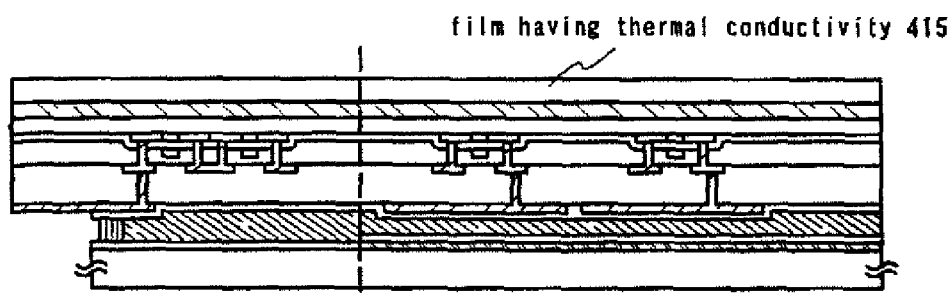
Fig. 11B condition after a transfer member is adhered
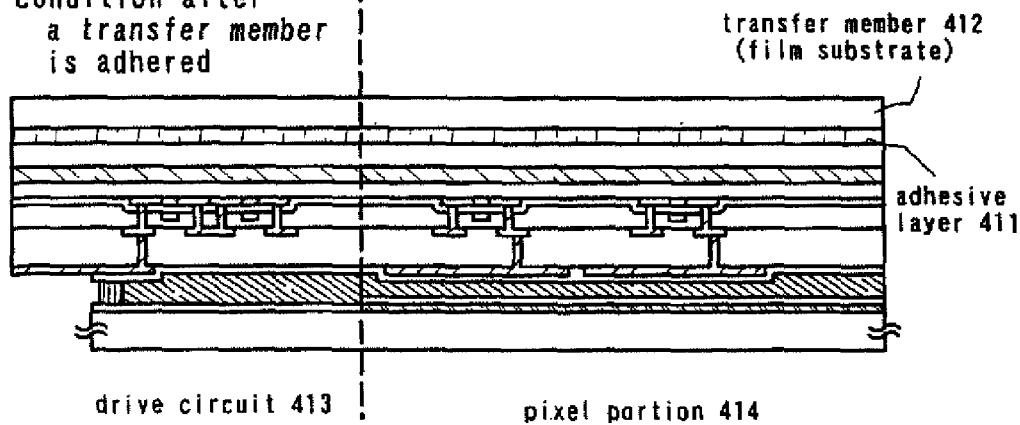

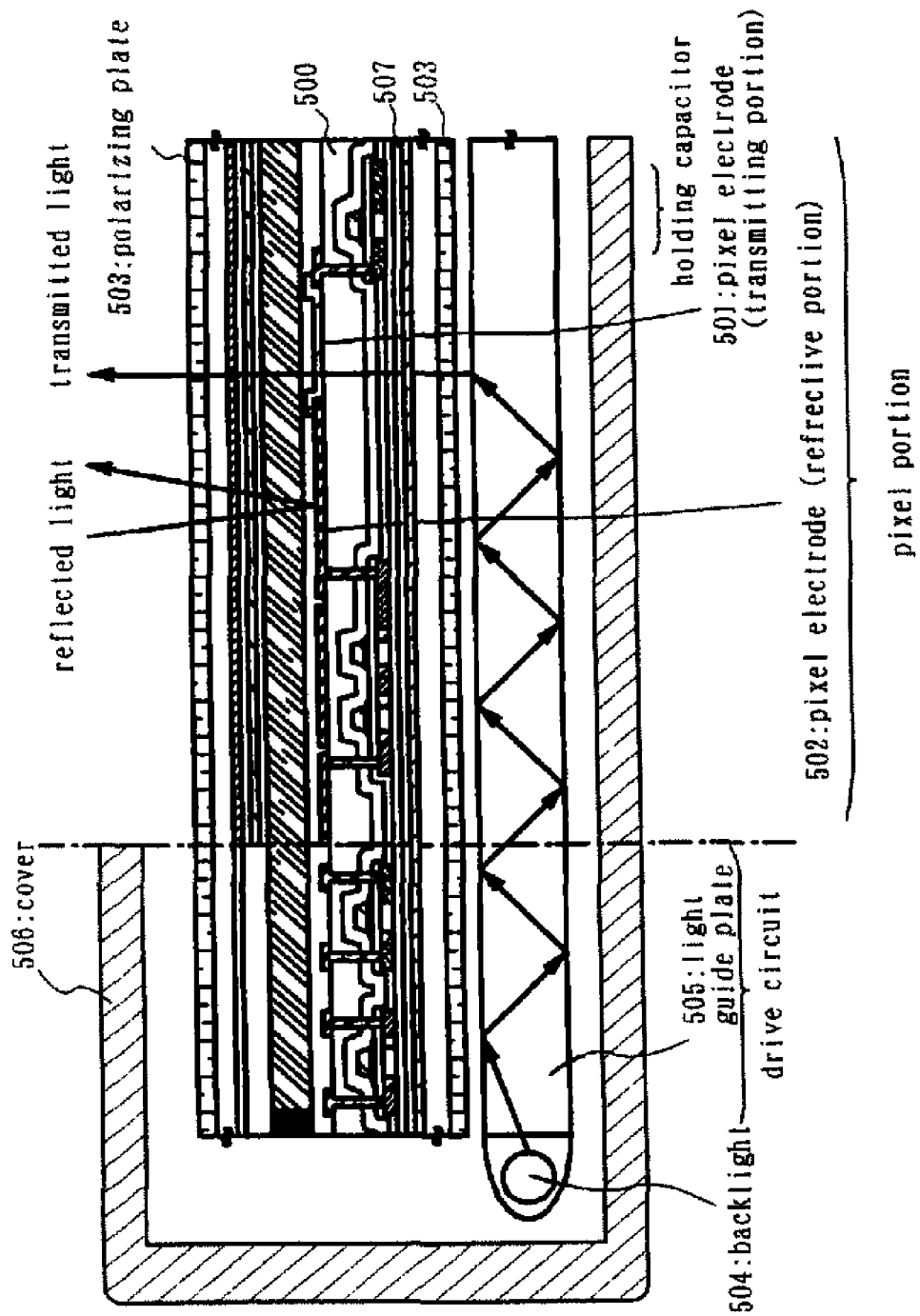

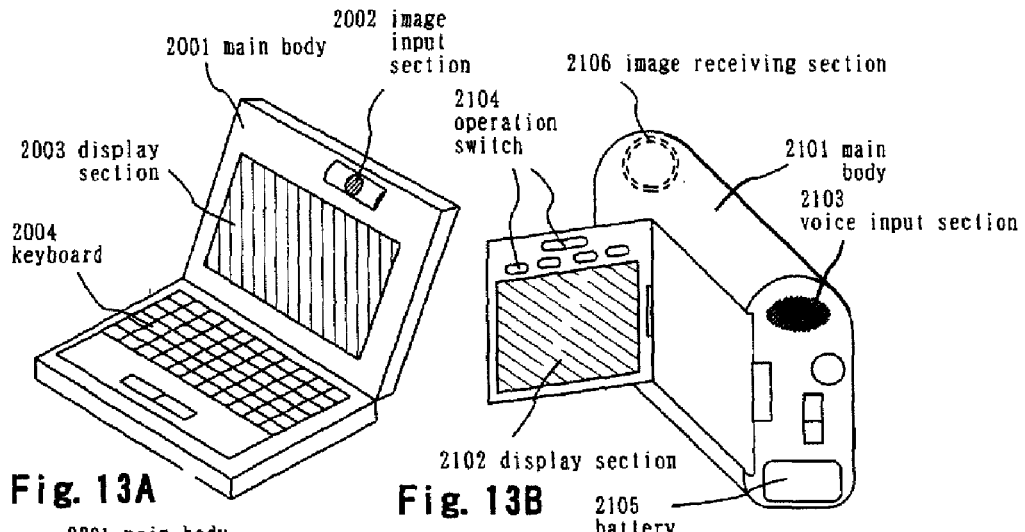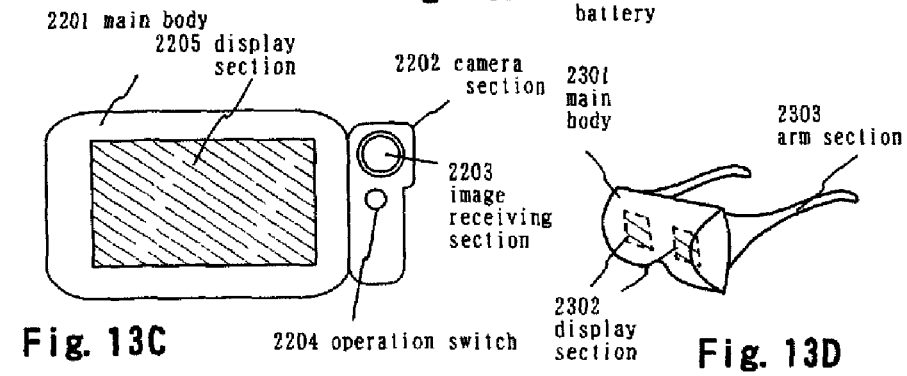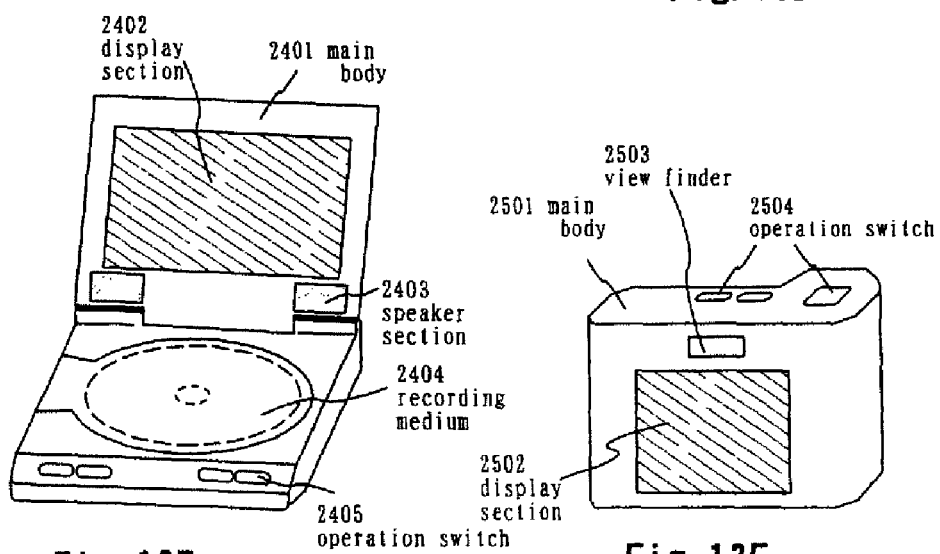

LIGHT EMITTING DEVICE, SEMICONDUCTOR DEVICE, AND METHOD OF FABRICATING THE DEVICES

CROSS-REFERENCE TO RELATED APPLICATIONS

This application is a continuation application of U.S. application Ser. No. 11/201,087, filed Aug. 11, 2005, now allowed, which is a divisional of U.S. application Ser. No. 10/199,496, filed Jul. 22, 2002, now U.S. Pat. No. 7,045,438, which claims the benefit of foreign priority applications filed in Japan as Serial No. 2001-228353 on Jul. 27, 2001 and Serial No. 2001-300021 on Sep. 28, 2001, all of which are incorporated by reference.

BACKGROUND OF THE INVENTION

1. Field of the Invention

The present invention relates to a semiconductor device having a circuit consisted of a thin film transistor (hereinafter, referred to as TFT) in which the peeled off layer peeled off has been pasted and transferred on a base member and a method of manufacturing the semiconductor device. For example, the present invention relates to an electro-optic device that is represented by a liquid crystal module, a light emitting device that is represented by an EL module and an electronic equipment on which such a device is mounted as a part.

It should be noted that in the present specification, the term "semiconductor device" indicates a device in general capable of functioning by utilizing the semiconductor characteristics, and an electro-optic device, a light emitting device, a semiconductor circuit and an electronic equipment are all semiconductor devices.

2. Related Art

In recent years, a technology constituting a thin film transistor (TFT) using a semiconductor thin film (in the range from about a few to a few hundreds nm in thickness) formed on the substrate having an insulating surface has drawn attention. A thin film transistor is widely applied to electronic devices such as an IC, an electro-optic device or the like, and particularly, there is an urgent need to be developed as a switching element for an image display device.

Although as for applications utilizing such an image display device, a variety of applications are expected, particularly, its utilization for portable apparatuses has drawn the attention. At present, although many glass substrates and quartz substrates are utilized, there are defaults of being easily cracked and heavy. Moreover, the glass substrates and quartz substrates are difficult to be made larger in therms of conducting a mass-production, and these are not suitable for that. Therefore, the attempt that a TFT element is formed on a substrate having flexibility, representatively, on a flexible plastic film has been performed.

However, since the heat resistance of a plastic film is low, it cannot help lowering the highest temperature of the process. As a result, at present, a TFT is formed which has not so excellent electric characteristics compared with those formed on the glass substrates. Therefore, a liquid crystal display device and light emitting element having a high performance by utilizing a plastic film have not been realized yet.

If a light emitting device or a liquid crystal display device constituted of an organic light emitting device (OLED) formed on a flexible substrate such as a plastic film can be fabricated, it can be obtained as a thin lightweight device and can be used in a display having a curved surface, a show window, etc. Use of such a device is not limited to use as a portable device, and the range of uses of such a device is markedly wide.

However, substrates made of plastics ordinarily have permeability to water and oxygen, which act to accelerate degradation of the organic light emitting layer. Therefore, light emitting devices using plastic substrates tend to have a shorter life. By considering this problem, a method has been used in which an insulating film of silicon nitride or silicon nitroxide is formed between a plastic substrate and an OLED to prevent mixing of water and oxygen in the organic light emitting layer.

Also, generally speaking, substrates formed of plastic film or the like are not resistant to heat. If the temperature at which an insulating film of silicon nitride or silicon nitroxide is formed on a plastic substrate is excessively high, the substrate deforms easily. If the film forming temperature is excessively low, a reduction in film quality results and it is difficult to effectively limit permeation of water and oxygen. There is also a problem in that when a device formed on a plastic film substrate or the like is driven, heat is locally produced to deform a portion of the substrate or to change the quality thereof.

Further, if the thickness of the insulating film of silicon nitride or silicon nitroxide is increased in order to prevent permeation of water and oxygen, a larger stress is caused in the film and the film cracks easily. If the film thickness is large, the film cracks easily when the substrate is bent. Also, a layer to be debonded may crack when it is bent at the time of separation from the substrate.

SUMMARY OF THE INVENTION

In view of the above-described problems, an object of the present invention is to provide semiconductor device in which deterioration due to permeation of water and oxygen can be limited, for example, a light emitting device having an OLED formed on a plastic substrate or a liquid crystal display device using a plastic substrate.

According to the present invention, a layer to be debonded, containing elements, is formed on a substrate, bonded to a supporting member, and debonded from the substrate, a thin film is thereafter formed in contact with the debonded layer, and the debonded layer with the thin film is adhered to a transfer member The thin film is grown in contact with the debonded layer to repair cracks caused in the debonded layer at the time of debonding. As the thin film in contact with the debonded layer, a film having thermal conductivity, e.g., film of aluminum nitride or aluminum nitroxide is used. This film dissipates heat from the elements and therefore has the effect of limiting degradation of the elements as well as the effect of preventing deformation and change in quality of the transfer member 22, e.g., a plastic substrate. The film having thermal conductivity also has the effect of preventing mixing of impurities such as water and oxygen from the outside.

An arrangement 1 of the present invention disclosed in this specification is a light emitting device characterized by having, on a substrate having an insulating surface, a light emitting element having a cathode, an organic compound layer in contact with the cathode, and an anode in contact with the organic compound layer, an insulating film in contact with the anode, and a film formed in contact with the insulating film and having thermal conductivity.

An arrangement 2 of the present invention is a light emitting device characterized by having a substrate having an insulating surface, a bonding layer in contact with the substrate, a film formed in contact with the bonding layer and having thermal conductivity and an insulating film in contact with the film having thermal conductivity, and a light emitting element formed on the insulating film, the light emitting element having a cathode, an organic compound layer in contact with the cathode, and an anode in contact with the organic compound layer.

Each of the above-described arrangements is characterized in that the film having thermal conductivity comprises a film transparent or translucent to visible light.

Also, each of the above-described arrangements is characterized in that the film having thermal conductivity is formed of a nitride containing aluminum, a nitroxide containing aluminum, or an oxide containing aluminum. As the film having thermal conductivity, a multilayer film formed of a combination of films of these materials may be used. For example, a multilayer of aluminum nitride (AlN) and aluminum nitroxide ($AlN_XO_Y$ (X>Y)), or a multilayer of aluminum nitroxide ($AlN_XO_Y$ (X>Y)) and aluminum oxynitride ($AlN_XO_Y$ (X<Y)) may be used.

Also, each of the above-described arrangements is characterized in that the film having thermal conductivity comprises a film containing at least nitrogen and oxygen, and that the composition ratio of oxygen to nitrogen in the film is 0.1 to 30%.

Also, each of the above-described arrangements is characterized in that the substrate having an insulating surface comprises a plastic substrate or a glass substrate.

An arrangement 3 of the present invention is a semiconductor device characterized by having a transfer member, a first bonding layer in contact with the transfer member, a film formed in contact with the first bonding layer and having thermal conductivity, an insulating film in contact with the film having thermal conductivity, a layer containing elements on the insulating layer, a second bonding layer (a sealing material or the like) in contact with the layer containing elements, and a supporting member in contact with the second bonding layer.

In the above-described arrangement, it is characterized in that if a liquid crystal display is fabricated, the supporting member is an opposed substrate, the elements are thin-film transistors connected to pixel electrodes, and a space between the pixel electrodes and the transfer member is filled with a liquid crystal material. As the transfer member and the opposed substrate, a plastic substrate or a glass substrate may be used.

An arrangement of the present invention relating to a method of fabricating a semiconductor device for realizing the structure in each of the above-described arrangements 1 to 3 includes:

a step of forming a nitride layer on a substrate;

a step of forming an oxide layer on the nitride layer;

a step of forming an insulating layer on the oxide layer;

a step of forming a layer containing elements on the insulating layer;

a step of bonding a supporting member to the layer containing elements, and thereafter debonding the supporting member from the substrate by a physical means at a position in the oxide layer or at an interface on the oxide layer;

a step of forming a film having thermal conductivity on the insulating layer or the oxide layer; and a step of bonding a transfer member to the film having thermal conductivity to interpose the elements between the supporting member and the transfer member.

In this specification, "physical means" refers to a means recognized not by chemistry but by physics, more specifically a dynamic means or mechanical means having a process capable of reducing to a dynamic law, i.e., a means capable of changing some dynamic energy (mechanical energy). However, it is necessary that, at the time of debonding by a physical means, the strength of bonding between the oxide layer and the nitride layer be smaller than the strength of bonding between the oxide layer and the supporting member.

The above-described arrangement relating to the method of fabricating a semiconductor device is characterized in that the film having thermal conductivity is formed of a nitride containing aluminum, a nitroxide containing aluminum, or an oxide containing aluminum. As the film having thermal conductivity, a multilayer film formed of a combination of films of these materials may be used.

The above-described arrangement relating to the method of fabricating a semiconductor device is also characterized in that the nitride layer contains a metallic material, and that the metallic material is a single layer of an element selected from the group consisting of Ti, Al, Ta, W, Mo, Cu, Cr, Nd, Fe, Ni, Co, Ru, Rh, Pd, Os, Ir, and Pt, an alloy or a chemical compound having the element as a main component, or a multilayer formed of such materials.

The above-described arrangement relating to the method of fabricating a semiconductor device is also characterized in that a heat treatment or a treatment using irradiation with laser light is performed before debonding by the physical means.

The above-described arrangement relating to the method of fabricating a semiconductor device is also characterized in that the oxide layer is a single layer of a silicon oxide material or a metallic oxide material, or a multilayer of these materials.

The above-described arrangement relating to the method of fabricating a semiconductor device is also characterized in that the elements are thin-film transistors having a semiconductor layer as an active layer, and that the step of forming the semiconductor layer includes crystallizing a semiconductor layer of an amorphous structure by a heat treatment or a treatment using irradiation with laser light to obtain a semiconductor layer of a crystalline structure.

The above-described arrangement relating to the method of fabricating a semiconductor device is also characterized in that if a liquid crystal display is fabricated, the supporting member is an opposed substrate, the elements have pixel electrodes, and a space between the pixel electrodes and the opposed substrate is filled with a liquid crystal material.

In the above-described arrangement relating to the method of fabricating a semiconductor device, if a light emitting device using an element typified by an OLED is fabricated, it is desirable that the light emitting element be completely isolated from the outside with the supported member used as a sealing member to prevent materials such as water and oxygen which accelerate degradation of an organic compound layer from entering from the outside. Specifically, in such a case, it is characterized in that the element is a light emitting element.

In each of the above-described arrangements, to facilitate debonding, a heat treatment or a treatment using irradiation with laser light may be performed before debonding by the physical means. In such a case, a material capable of absorbing laser light may be selected as the material of the nitride layer and the interface between the nitride and the oxide may be heated to make separation easier. However, if laser light is used, a transparent material is used to form the substrate.

To facilitate debonding, a granular oxide material may be provided on the nitride layer and an oxide layer for covering the granular oxide material may be provided, thus making separation easier.

The transfer member referred to in this specification is a member bonded to the debonded layer after debonding. The base material of the transfer member is not particularly specified. It may be a material of any composition, e.g., plastic, glass, metal, or ceramics. The supporting member referred to in this specification is a member bonded to the layer to be debonded when the layer is debonded by a physical means. The base material of the supporting member is not particularly specified. It may be a material of any composition, e.g., a plastic, glass, a metal, or a ceramic. The shape of the transfer member and the shape of the supporting member are not limited to a particular one. Each of the transfer member and the supporting member may have a flat surface or a curved surface, may be flexible, and may have the shape of a film. If it is desirable to achieve a reduction in weight with the highest priority, a plastic substrate in film form, e.g., a plastic substrate made of polyethylene terephthalate (PET), polyether sulfone (PES), polyethylene naphthalate (PEN), polycarbonate (PC), nylon, polyetheretherketone (PEEK), polysulfone (PSF), polyether imide (PEI), polyallylate (PAR), or polybutylene terephthalate (PBT) is preferred.

The present invention can be carried out without limiting the bonding method. Another arrangement relating to a method of fabricating a semiconductor device for realizing the structure in each of the above-described arrangements 1 to 3 includes:

a step of forming on a substrate a layer to be debonded containing elements;

a step of bonding a supporting member to the layer to be debonded;

a step of debonding the supporting member from the substrate by a physical means; and a step of forming a film having thermal conductivity in contact with the layer to be debonded.

As the debonding method in the above-described arrangements, a well-known technique can be used. Examples of such a technique are a method in which a separation layer is provided between the layer to be debonded and the substrate, and in which the separation layer is removed by a chemical solution (etchant) to separate the layer to be debonded from the substrate, and a method in which a separation layer formed of an amorphous silicon (or polysilicon) is provided between the layer to be debonded and the substrate, and in which the separation layer is irradiated with laser light passing through the substrate to release hydrogen contained in the amorphous silicon, whereby a space for separation between the layer to be debonded and the substrate is formed. In the case of separation using laser light, it is desirable that the elements contained in the layer to be debonded be formed by setting the heat treatment temperature to 410° C. or lower to avoid release of hydrogen before debonding.

In this specification, "laser light" refers to laser light generated from a laser light source, e.g., a solid-state laser such as a YAG laser or $YVO_4$ laser, or a gas laser such as an excimer laser. The mode of laser oscillation may be either of continuous oscillation or pulse oscillation. Any beam shape, e.g., line irradiation or spot irradiation may be used. Also, the scanning method is not particularly specified.

Still another arrangement relating to a method of fabricating a semiconductor device for realizing the structure in each of the above-described arrangements 1 to 3 includes:

a step of forming on a substrate a layer to be debonded containing elements;

a step of bonding a supporting member to the layer to be debonded;

a step of attaching a flexible printed circuit (FPC) to a portion of the layer to be debonded;

a step of fixing the supporting member by covering a connection between the FPC and the layer to be debonded with an organic resin; and a step of debonding the supporting member from the substrate by a physical means.

The above-described arrangement includes, after the debonding step, a step of forming a film having thermal conductivity in contact with the debonded layer, and a step of bonding a transfer member to the film having thermal conductivity to interpose the debonded layer between the supporting member and the transfer member.

BRIEF DESCRIPTION OF THE DRAWINGS

In the accompanying drawings:

FIGS. 1A, 1B, and 1C are diagrams showing fabricating steps in accordance with the present invention;

FIGS. 2A, 2B, and 2C are diagrams showing fabricating steps in accordance with the present invention;

FIG. 7 is a cross-sectional view of an EL module;

FIG. 8 is a cross-sectional view of an EL module;

FIGS. 10A, 10B, and 10C are diagrams showing LCD fabricating steps;

FIGS. 11A and 11B are diagrams showing LCD fabricating steps;

FIG. 12 is a cross-sectional view of a half-transmission type of liquid crystal display;

FIGS. 13A to 13F are diagrams showing examples of electronic equipment;

DESCRIPTION OF THE PREFERRED EMBODIMENTS

Figure 3A:
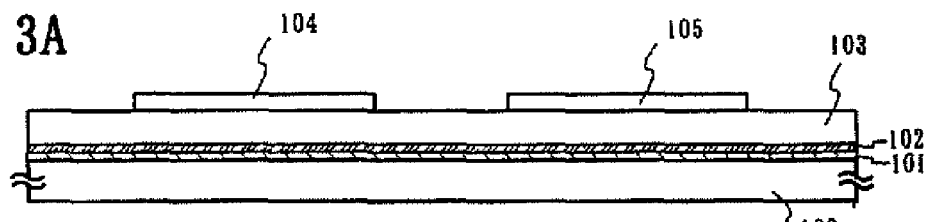
FIGS. 3A, 3B, 3C, and 3D are diagrams showing TFT fabricating steps.

The present invention will be described with respect to an embodiment mode thereof.

The procedure of fabrication of a typical light emitting device using the present invention will be briefly described with reference to FIGS. 1 and 2.

FIG. 1A illustrates a substrate 10, a nitride layer 11, an oxide layer 12, a base insulating layer 13, elements 14a to 14c, an OLED 15, and an interlayer insulating film 16.

As the substrate 10 shown in FIG. 1A, a glass substrate, a quartz substrate, a ceramic substrate or the like may be used. A silicon substrate, a metallic substrate or a stainless substrate may alternatively be used.

First, the nitride layer 11 is formed on the substrate 10, as shown in FIG. 1A. A nitride material containing a metallic material is used as the nitride layer 11. A typical example of the metallic material is a single layer of an element selected from the group consisting of Ti, Al, Ta, W, Mo, Cu, Cr, Nd, Fe, Ni, Co, Ru, Rh, Pd, Os, Ir, and Pt, an alloy or a chemical compound having the element as a main component, or multiple layers of such materials. A single layer of a nitride of the element, e.g., titanium nitride, tantalum nitride, tungsten nitride, or molybdenum nitride, or multiple layers of such materials may be used as the nitride layer 11. A metallic layer formed of tungsten may be used in place of the nitride layer 11.

Subsequently, the oxide layer 12 is formed on the nitride layer 11. A typical example of a material used to form the oxide layer 12 is silicon oxide, silicon oxynitride or an oxide of a metal. To form the oxide layer 12, any of film forming methods such as sputtering, plasma CVD and application may be used.

According to the present invention, it is important to make the oxide layer 12 and the nitride layer 11 have different film stresses. The film thickness of each layer is appropriately selected from the range of 1 to 1000 nm to adjust the film stress in the layer. While an example of the structure in which the nitride layer 11 is formed in contact with the substrate 10 and which is selected for simplification of the process is shown in FIG. 1, an insulating layer or a metallic layer capable of functioning as a buffer layer may be formed between the substrate 10 and the nitride layer 11 to improve the adhesion to the substrate 10.

Subsequently, a layer to be debonded is formed on the oxide layer 12. The layer to be debonded may be formed as a layer containing various elements (a thin-film diode, a photoelectric conversion element having a silicon PIN junction, silicon resistance element, etc.) typified by a TFT. A heat treatment may be performed on the layers in such a temperature range that the substrate 10 can withstand. In the present invention, even though the film stress in the oxide layer 12 and the film stress in the nitride layer 11 are different, film separation or the like is not caused by a heat treatment in the process of forming the layer to be debonded. As the layer to be debonded, the elements 14a and 14b for a drive circuit 23 and the element 14c in a pixel portion 24 are formed on the base insulating layer 13, the OLED 15 which connects electrically to the element 14 of the pixel portion 24 is formed, and the interlayer insulating film 16 having a thickness of 10 to 1000 nm is formed so as to cover the OLED (FIG. 1A).

If irregularities are formed in the surface after formation of the nitride layer 11 and the oxide layer 12, the surface may be flattened before or after the base insulating layer is formed. Flattening has the effect of improving coverage in the layer to be debonded and, hence, the effect of stabilizing element characteristics in the case where the layer to be debonded containing elements is formed. Therefore it is preferable to perform flattening. As a treatment for this flattening, etchback, i.e., flattening by etching or the like after formation of an applied film (resist film or the like), chemical mechanical polishing (CMP), or the like may be performed.

Subsequently, a film 17 having thermal conductivity is formed on the interlayer insulating film 16 (FIG. 1B). The film 17 having thermal conductivity may be formed adjacently to the OLED 15 instead of being formed on the interlayer insulating layer 16. If the film 17 is formed adjacently to the OLED 15, it is preferred that the film 17 having thermal conductivity be an insulating film. As the film 17 having thermal conductivity, aluminum nitride (AlN), aluminum nitroxide ($AlN_XO_Y$ (X>Y)), aluminum oxynitride ($AlN_XO_Y$ (X<Y)), aluminum oxide (AlO) or beryllium oxide (BeO), for example, may be used. If aluminum nitroxide ($AlN_XO_Y$ (X>Y)) is used, it is preferred that the composition ratio of oxygen to nitride in the film be 0.1 to 30%. It is also preferred that the film 17 having thermal conductivity be a film transparent or translucent to visible light. In this embodiment mode, an aluminum nitride (AlN) film having a light-transmitting property and having a markedly high thermal conductivity of 2.85 W/cm·K and an energy gap of 6.28 eV (RT) is formed by sputtering. For example, an aluminum nitride (AlN) target is used and film forming is performed in an atmosphere in which argon gas and nitrogen gas are mixed. Alternatively, film forming may be performed in a nitrogen gas atmosphere by using an aluminum (Al) target. The film 17 having thermal conductivity also has the effect of preventing materials such as water and oxygen which accelerate degradation of OLED 15 from entering from the outside.

Figure 15:
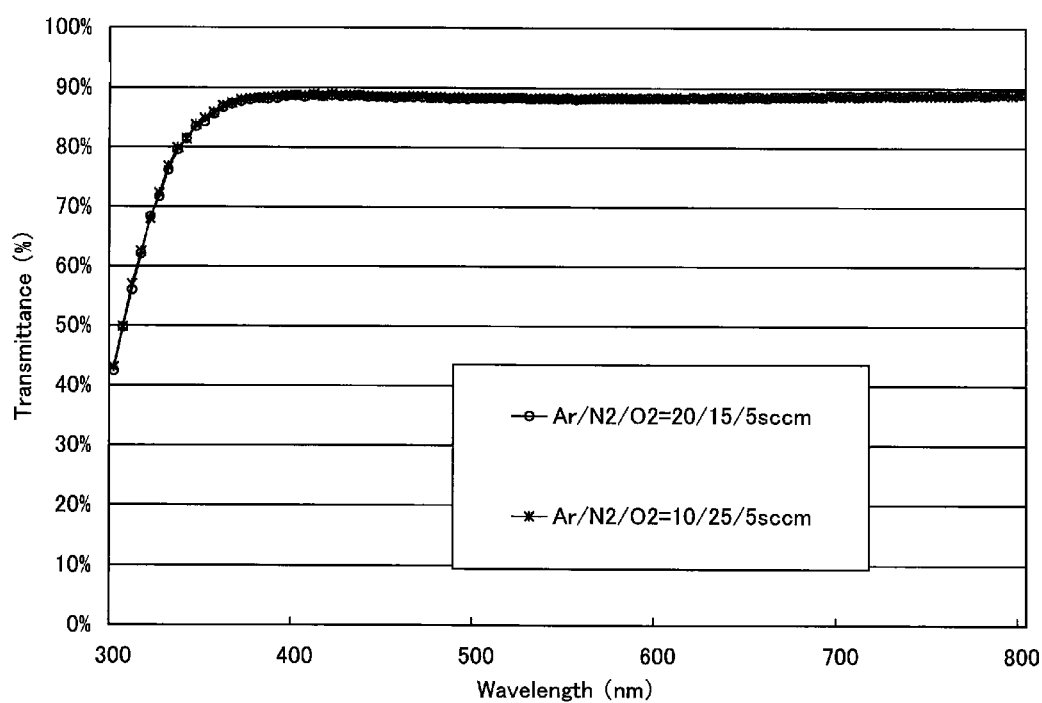
FIG. 15 is a graph showing the transmittance of $AlN_XO_Y$ film of the present invention.

FIG. 15 shows the transmittance of $AlN_XO_Y$ film having a thickness of 100 nm. As shown in FIG. 15, the light-transmitting property of the $AlN_XO_Y$ film is markedly high (the transmittance in the visible light region is 80 to 90%) and does not obstruct emission of light from the light emitting element.

Figure 16:
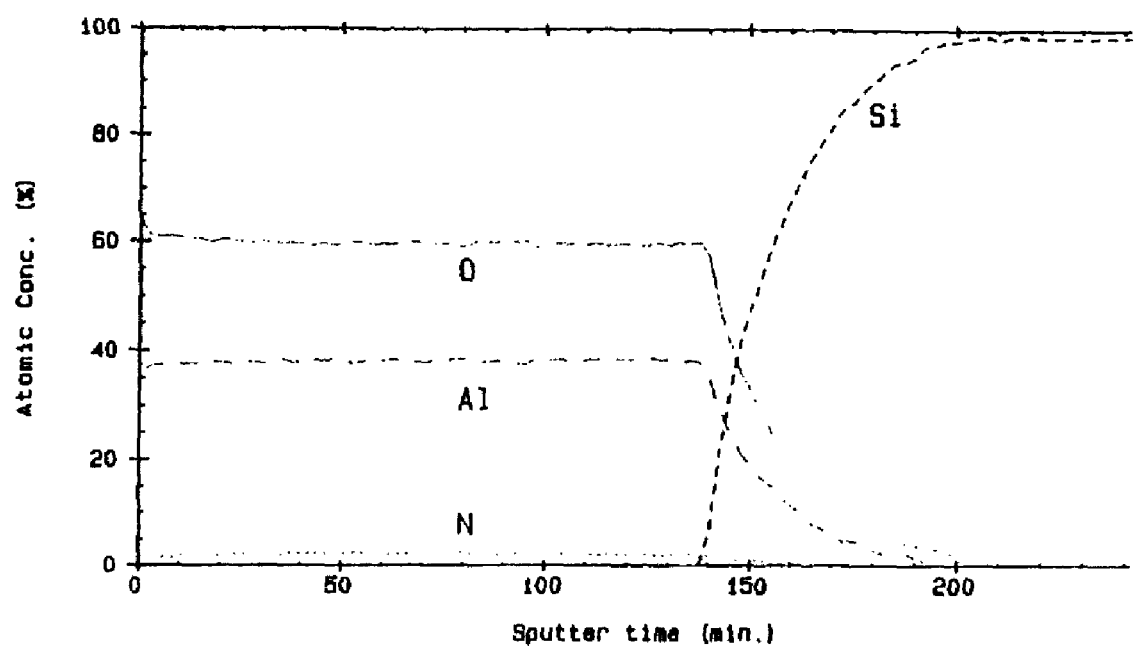
FIG. 16 is a graph showing the results of ESCA analysis of $AlN_XO_Y$ film of the present invention.

According to the present invention, the $AlN_XO_Y$ film is formed by sputtering, for example, in an atmosphere in which argon gas, oxygen gas and nitrogen gas are mixed, with an aluminum nitride (AlN) used as a target. The $AlN_XO_Y$ film may have several atomic percent or more, preferably 2.5 to 47.5 atm % of nitrogen. The nitrogen concentration can be adjusted by suitably controlling sputtering conditions (substrate temperature, raw-material gas, gas flow rate, film forming pressure, and the like). FIG. 16 shows the composition of the $AlN_XO_Y$ film obtained in this manner and analyzed by electron spectroscopy for analysis (ESCA). Alternatively, film forming may be performed in an atmosphere containing nitrogen gas and oxygen gas by using an aluminum (Al) target. The film forming method is not limited to sputtering. Evaporation or any other known technique may be used.

To confirm the water/oxygen blocking effect of the $AlN_XO_Y$ film, an experiment was made in which a sample having an OLED sealed on a film substrate with a 200 nm thick $AlN_XO_Y$ film and a sample having an OLED sealed on a film substrate with a 200 nm thick SiN film were prepared and changes of the samples with time in a water vapor atmosphere heated at 85 degrees were examined. The life of the OLED in the sample having the $AlN_XO_Y$ film was longer than that of the OLED in the sample having the SiN film. The former OLED was able to emit light for a longer time. From the results of this experiment, it can be understood that the $AlN_XO_Y$ film is more effective than the SiN film in preventing materials such as water and oxygen which accelerate degradation of the organic compound layer from entering from the outside of the apparatus. In addition, AlN and $AlN_XO_Y$ are more difficult to crack than SiN. Therefore, A film formed of AlN or $AlN_XO_Y$ is more preferable than a film formed of SiN for attaching to a plastic substrate.

Figure 17:
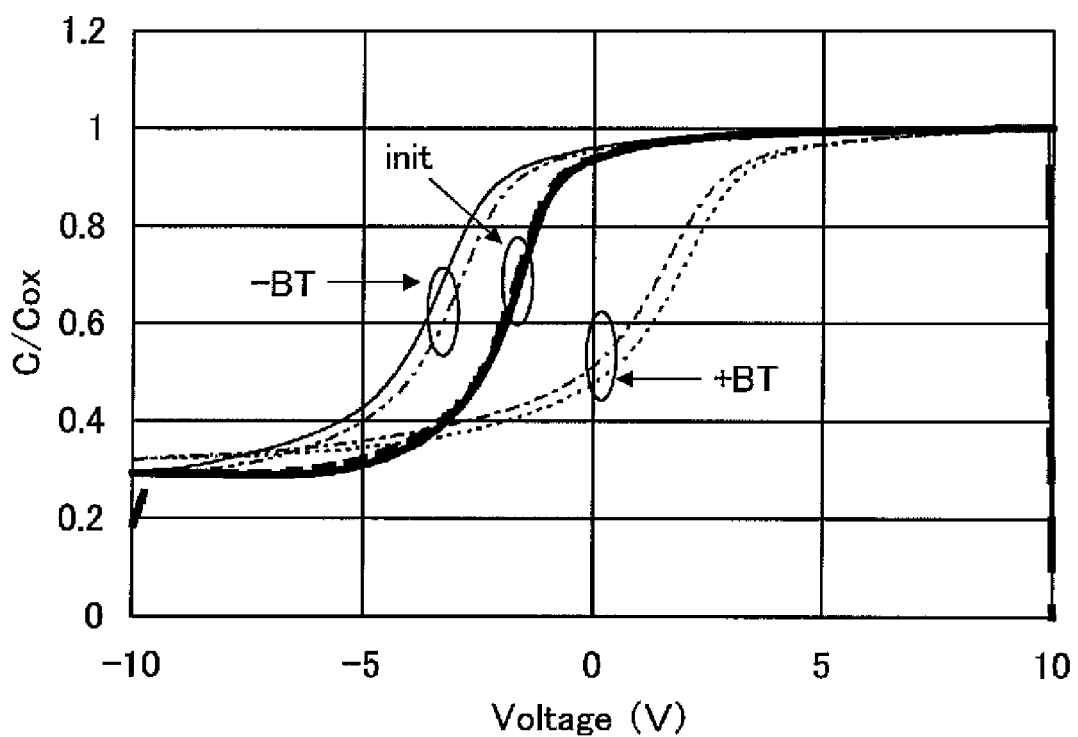
FIG. 17 is a graph of a MOS characteristic ($AlN_XO_Y$ film) with BT stress.
Figure 18:
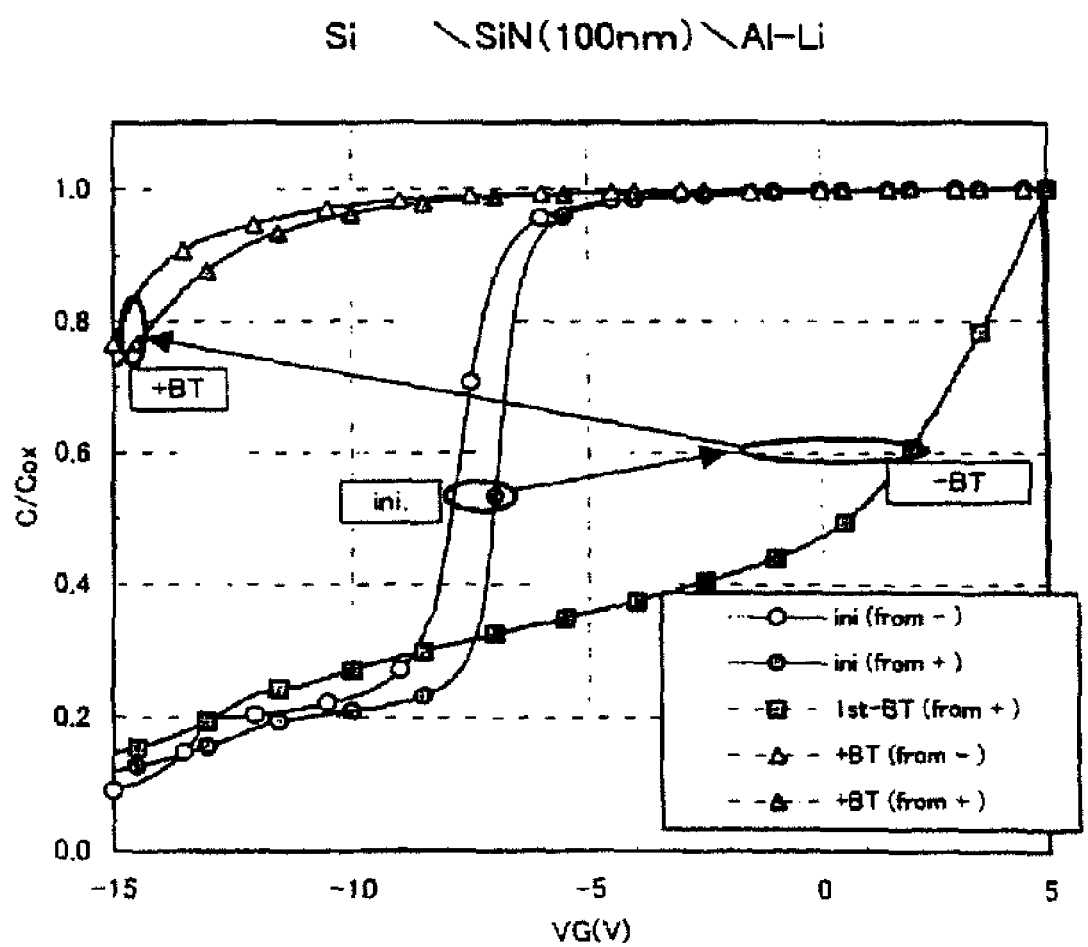
FIG. 18 is a graph of a MOS characteristic (SiN film) with BT stress (comparative example).

To confirm the alkali metal blocking effect of the $AlN_XO_Y$ film, another experiment was made in which a 50 nm thick thermally oxidized film was formed on a silicon substrate; a 40 nm thick $AlN_XO_Y$ film was formed on the thermally oxidized film; an aluminum electrode containing Li was formed on the $AlN_XO_Y$ film; an aluminum electrode containing Si was formed on the silicon substrate surface opposite from that surface on which the films were formed; and the sample was heat-treated at 300° C. for one hour and then underwent a BT stress test (±1.7 MV/cm, 150° C., 1 hour). A MOS characteristic (C-V characteristic) was thereby measured. FIG. 17 shows the results of this experiment. In the C-V characteristic shown in FIG. 17, a shift in the plus direction occurred when a plus voltage, i.e., +BT, was applied. It was confirmed therefrom that the cause of the shift was not Li, and that the $AlN_XO_Y$ film had an alkali metal blocking effect. For comparison, an AlLi alloy was formed on the MOS with an insulating film (100 nm thick silicon nitride film) interposed therebetween, and changes in MOS characteristic were also examined. FIG. 18 shows the results of this experiment. In the C-V characteristic shown in FIG. 18, a large shift in the minus direction occurred when a plus voltage, i.e., +BT, was applied. It is thought that a major cause of this shift is mixture of Li in the active layer.

A supporting member 19 for fixing the layer to be debonded to enable stripping of the substrate 10 by a physical means is adhered by using a bonding layer 18 of an epoxy resin or the like (FIG. 1C). This step is based on the assumption that the mechanical strength of the layer to be debonded is not sufficiently high. If the mechanical strength of the layer to be debonded is sufficiently high, the layer to be debonded can be debonded without a supporting member on which the layer is fixed.

Subsequently, the substrate 10 on which the nitride layer 11 is formed is stripped off by a physical means. It can be stripped off by a comparatively small force since the film stress in the oxide layer 12 and the film stress in the nitride layer 11 are different from each other. While strength of bonding between the nitride layer and the oxide layer is high enough to maintain bonding under thermal energy, the film stresses in the nitride and oxide layers are different from each other and a strain due to the stresses exists between the nitride and oxide layers. Therefore, the bonding between the nitride and oxide layers is not strong under dynamic energy and this condition is most suitable for separation. Thus, the layer to be debonded, formed on the oxide layer 12, can be separated from the substrate 10. FIG. 2A shows a state after debonding. This debonding method enables not only debonding of a small-area layer to be debonded but also high-yield debonding through the entire area of a large-area layer to be debonded. Debonding can be performed in the same manner even in a case where a metallic layer formed of tungsten is used in place of the nitride layer 11.

A film 20 having thermal conductivity is again formed on the surface from which the substrate has been stripped off (FIG. 2B). Cracks caused at the time of debonding can be repaired by using the film 20 having thermal conductivity. As the film 20 having thermal conductivity, aluminum nitride (AlN), aluminum nitroxide ($AlN_XO_Y$ (X>Y)), aluminum oxynitride ($AlN_XO_Y$ (X<Y)), aluminum oxide (AlO) or beryllium oxide (BeO), for example, may be used. It is preferred that the film 20 having thermal conductivity be a film transparent or translucent to visible light. In this embodiment mode, an aluminum nitride (AlN) film having a markedly high thermal conductivity of 2.85 W/cm·K and an energy gap of 6.28 eV (RT) is formed by sputtering. The film 20 having thermal conductivity also has the effect of preventing materials such as water and oxygen which accelerate degradation of OLED 15 from entering from the outside.

The structure in which the OLED 15 is interposed between the two layers of films 17 and 20 having thermal conductivity is thus formed to completely isolate the OLED 15 from the outside. However, a structure in which only one of the two layers of films 17 and 20 is formed may alternatively be used.

The film thickness of each of the two layers of films 17 and 20 having thermal conductivity be set as desired in the range of 20 nm to 4 μm.

Subsequently, the debonded layer is attached to a transfer member 22 by a bonding layer 21 such as an epoxy resin. In this embodiment mode, a plastic film substrate is used as the transfer member 22 in order that the total weight of the light emitting device be reduced. If the mechanical strength of the debonded layer is sufficiently high, it is not necessary to specially provide the transfer member.

Thus, the light emitting device having the OLED formed on the flexible plastic substrate is completed. Since in the structure of this light emitting device, the elements 14a to 14c and the OLED 15 are interposed between the two layers of films 17 and 20 having thermal conductivity, heat produced by the OLED 15 and the elements 14a to 14c can be dissipated. The films 17 and 20 having thermal conductivity are also capable of limiting degradation due to permeation of water and oxygen. If necessary, the supporting member or the transfer member is cut to be formed into a desired shape. A flexible printed circuit (FPC) (not shown) is attached to the debonded layer by using a well-known technique. The FPC may be attached before debonding of the layer to be debonded instead of being attached after debonding. Also, to increase the mechanical strength of bonding between the FPC and the layer to be debonded, an organic resin or the like may be formed to fix the FPC by covering the bonding portion between the FPC and the layer to be debonded.

The transfer member referred to in this specification is a member bonded to the debonded layer after debonding. The base material of the transfer member is not particularly specified. It may be a material of any composition, e.g., a plastic, glass, a metal, or a ceramic. The supporting member referred to in this specification is a member bonded to the layer to be debonded when the layer is debonded by a physical means. The base material of the supporting member is not particularly specified. It may be a material of any composition, e.g., a plastic, glass, a metal, or a ceramic. The shape of the transfer member and the shape of the supporting member are not limited to a particular one. Each of the transfer member and the supporting member may have a flat surface or a curved surface, may be flexible, and may have the shape of a film. If weight saving is the top priority, a film-type plastic substrate, for example, a plastic substrate including polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like is preferable.

The present invention of the above-mentioned aspect is further illustrated in detail by the following Embodiments.

Embodiment 1

Embodiment of the present invention will be described with reference to FIGS. 3 to 5. In this embodiment, a method of manufacturing CMOS circuit at the same time, which is complementary combining an n-channel type TFT and a p-channel type TFT on a same substrate is explained in detail.

First, the nitride layer 101, the oxide layer 102 and the base insulating film 103 are formed on the substrate 100, after a semiconductor film having a crystal structure was obtained, a semiconductor layers 104 to 105 isolated in a island shape are formed by etching processing in the desired shape.

As the substrate 100, the glass substrate (#1737) is used.

Moreover, as the metal layer 101, an element selected from Ti, Al, Ta, W, Mo, Cu, Cr, Nd, Fe, Ni, Co, Ru, Rh, Pd, Os, It and Pt, or a single layer consisted of alloy materials or compound materials whose principal components are the foregoing elements or a lamination of these may be used. More preferably, a single layer consisted of these nitrides, for example, titanium nitride, tungsten nitride, tantalum nitride, molybdenum nitride or a lamination of these may be used. Here, titanium nitride film having film thickness of 100 nm is utilized by a sputtering method. Also, when the adhesion of the nitride layer 101 to the substrate 100, a buffer layer may be provided therebetween.

Moreover, as the oxide layer 102, a single layer consisted of a silicon oxide material or a metal oxide material, or a lamination of these may be used. Here, a silicon oxide film having film thickness of 200 nm by a sputtering method is used. The bond strength between the nitride layer 101 and the oxide layer 102 is strong in heat treatment, the film peeling (also referred to as solely "peeling") or the like does not occur. However, it can be easily peeled off on the inside of the oxide layer or on the interface by the physical means.

Subsequently, as a base insulating layer 103, a silicon oxynitride film (composition ratio Si=32%, O=27%, N=24% and H=17%) prepared from the raw material gases $SiH_4$, $NH_3$, and $N_2O$ was formed (preferably, 10 to 200 nm) in thickness of 50 nm at 400° C. of the film formation temperature by a plasma CVD method. Subsequently, after the surface was washed by ozone water, the oxide film of the surface was removed by dilute hydrofluoric acid (1:100 dilution). Subsequently, a silicon oxynitride film 103b (composition ratio Si=32%, O=59%, N=7% and H=2%) prepared from the raw material gases $SiH_4$ and $N_2O$ was lamination-formed in thickness of 100 nm (preferably, 50 to 200 nm) at 400° C. of the film formation temperature by a plasma CVD method, and further, a semiconductor layer (here, an amorphous silicon layer) having an amorphous structure was formed in thickness of 54 nm (preferably, 25 to 80 nm) at 300° C. of the film formation temperature without the air release by a plasma CVD method.

In this embodiment, although the base film 103 is shown as a two-layer structure, a single layer film of the foregoing insulating film or a layer as a structure in which two layers or more are laminated may be formed. Moreover, there are no limitations to materials for a semiconductor film, but preferably, it may be formed using a silicon or a silicon germanium ($Si_xGe_{1-x}$ (X=0.0001-0.02)) alloy or the like by the known methods (sputtering method, LPCVD method, plasma CVD method or the like). Moreover, a plasma CVD apparatus may be single wafer type apparatus, or batch type apparatus. Moreover, the base insulating film and the semiconductor film may be continuously formed in the same film formation chamber without contacting with the air.

Subsequently, after the surface of the semiconductor film having an amorphous structure was washed, an oxide film having an extremely thin thickness of about 2 nm is formed on the surface with ozone water.

Next, nickel acetate solution containing 10 ppm of nickel in the weight conversion was coated by a spinner. A method of spreading over the entire surface with nickel element by a sputtering method instead of coating may be employed.

Subsequently, a semiconductor film having a crystal structure was formed by performing the heat treatment and crystallizing it. For this heat treatment, the heat treatment of an electric furnace or the irradiation of strong light may be used. In the case where it is performed by utilizing the heat treatment of the electric furnace, it may be performed at 500° C. to 650° C. for 4 to 24 hours. Here, after the heat treatment (500° C., one hour) for dehydrogenation was carried out, a silicon film having a crystal structure was obtained by performing the heat treatment for crystallization (550° C., 4 hours). It should be noted that although here, crystallization was performed using the heat treatment by the furnace, however, the crystallization may be performed by a lamp anneal apparatus. It should be noted that here, a crystallization technology using nickel as a metal element for promoting the crystallization of silicon is used. However, the other known crystallization technology, for example, solid phase crystallization method or laser crystallization method may be used.

Subsequently, after the oxide film of the surface of the silicon film having a crystal structure was removed by dilute hydrofluoric acid or the like, the irradiation of the first laser beam (XeCl: wavelength 308 nm) for enhancing the crystallization ratio and repairing the defaults remained within the crystal grain is performed in the air, or in the oxygen atmosphere. For a laser beam, an excimer laser beam of 400 nm or less of wavelength, the second higher harmonic wave, the third higher harmonic wave of YAG laser are used. When the pulse laser beam having about 10 to 1000 Hz of repeated frequency is used, the relevant laser beam is condensed at 100 to 500 mJ/cm² by an optical system, irradiated with overlap ratio of 90 to 95% and it may be made it scan the surface of the silicon film. Here, the irradiation of the first laser beam is performed at repeated frequency of 30 Hz, 393 mJ/cm² of energy density in the air. It should be noted that since it is performed in the air, or in the oxygen atmosphere, an oxide film is formed on the surface by the irradiation of the first laser beam.

Subsequently, after the oxide film formed by irradiation of the first laser beam was removed by dilute hydrofluoric acid, the irradiation of the second laser beam is performed in the nitrogen atmosphere or in the vacuum, thereby flattening the surface of the semiconductor film. For this laser beam (the second laser beam), an excimer laser beam having a wavelength of 400 nm or less, the second higher harmonic wave, the third higher harmonic wave of YAG laser are used. The energy density of the second laser beam is made larger than the energy density of the first laser beam, preferably, made larger by 30 to 60 mJ/cm². Here, the irradiation of the second laser beam is performed at 30 Hz of the repeated frequency and 453 mJ/cm² of energy density, P-V value (Peak to Valley, difference between the maximum value and minimum value) of the concave and convex in the surface of the semiconductor film is to be 50 nm or less. This P-V value is obtained by an AFM (atomic force microscope).

Moreover, in this embodiment, the irradiation of the second laser beam was performed on the entire surface. However, since the reduction of the OFF-state current is particularly effective to the TFT of the pixel section, a step of selectively irradiating may be made on the pixel section at least.

Subsequently, a barrier layer consisted of an oxide film of total 1 to 5 nm in thickness is formed by processing the surface with ozone water for 120 seconds.

Subsequently, an amorphous silicon film containing argon element which is to be gettering site is formed in film thickness of 150 nm on the barrier layer by a sputtering method. The film formation conditions by a sputtering method of this embodiment are made as 0.3 Pa of film formation pressure, 50 (sccm) of gas (Ar) volumetric flow rate, 3 kW of film formation power, and 150° C. of the substrate temperature. It should be noted that the atomic percentage of argon element contained in the amorphous silicon film under the above-described conditions is in the range from $3\times10^{20}/cm^3$ to $6\times10^{20}/cm^3$, the atomic percentage of oxygen is in the range from $1\times10^{19}/cm^3$ to $3\times10^{19}/cm^3$. Then, the gettering is performed by carrying out the heat treatment at 650° C. for 3 minutes using a lamp anneal apparatus.

Subsequently, after the amorphous silicon film containing argon element that is the gettering site was selectively removed by using the barrier layer as an etching stopper, the barrier layer is selectively removed with dilute hydrofluoric acid. It should be noted that since when gettering, nickel tends to easily move into the higher oxygen density region, it is desirable that the barrier layer consisted of an oxide film is removed after the gettering. In this embodiment, an example of conducting a gettering with argon element is shown, however it is not limited to this method. Another gettering method can also be used.

Subsequently, after a thin oxide film is formed with the ozone water on the surface of the silicon film (also referred to as "polysilicon film") having the obtained crystal structure, a mask consisted of a resist is formed, and the semiconductor layers 104 and 105 isolated in an island shape is formed in the desired shape by etching processing. After the semiconductor layer was formed, the mask consisted of the resist is removed.

Subsequently, the oxide film was removed by an etchant containing hydrofluoric acid, and at the same time, the surface of the silicon film was washed, an insulating film whose principal component is silicon and which is to be a gate insulating film 106 is formed. In this embodiment, a silicon oxynitride film (composition ratio Si=32%, O=59%, N=7% and H=2%) is formed in thickness of 115 nm by plasma CVD method.

Figure 3B:
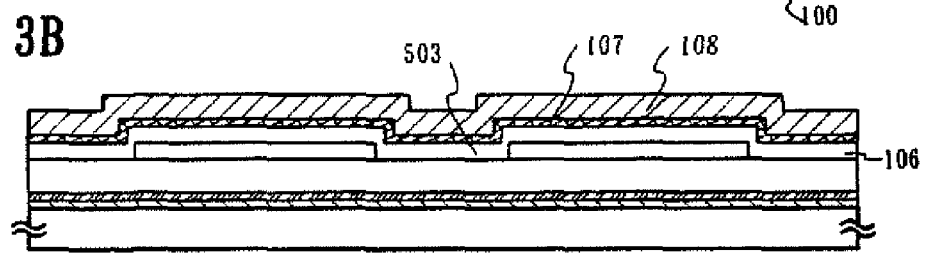

Subsequently, as shown in FIG. 3B, the first electrically conductive film 107 having film thickness of 20 to 100 nm and the second electrically conductive film 108 having film thickness of 100 to 400 nm are lamination-formed on the gate insulating film 106. In this embodiment, a tantalum nitride film having film thickness of 50 nm and a tungsten film having film thickness of 370 nm are laminated sequentially on the gate insulating film 106.

As an electrically conductive material for forming the first electrically conductive film and the second electrically conductive film, it is formed using an element selected from Ta, W, Ti, Mo, Al and Cu, or alloy material or compound material whose principal component is the foregoing element. Moreover, as the first electrically conductive film and the second electrically conductive film, a semiconductor film represented by a polycrystal silicon film in which impurity element such as phosphorus or the like is doped, and AgPdCu alloy may be used. Moreover, it is not limited to a two-layer structure. For example, it may be made a three-layer structure in which a tungsten film having film thickness of 50 nm, aluminum-silicon (Al—Si) alloy having film thickness of 500 nm, and a titanium nitride film having film thickness of 30 nm are in turn laminated. Moreover, in the case of a three-layer structure, instead of tungsten of the first electrically conductive film, tungsten nitride may be used, instead of aluminum-silicon (Al—Si) alloy of the second electrically conductive film, aluminum-titanium (Al—Ti) alloy film may be used, or instead of a titanium nitride film of the third electrically conductive film, a titanium film may be used. Moreover, it may be a single layer structure.

Figure 3C:
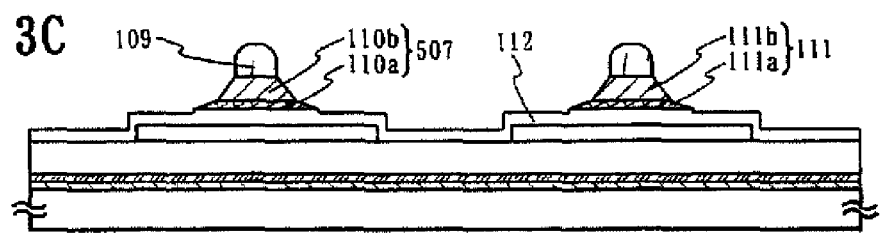

Next, as shown in FIG. 3C, mask 109 consisted of resists are formed by light exposure step, the first etching processing for forming a gate electrode and wirings is performed. As for an etching, ICP (Inductively Coupled Plasma) etching method may be used. The film can be etched in the desired tapered shape by appropriately adjusting the etching conditions (electric energy applied to the coil type electrode, electric energy applied to the electrode on the substrate side, temperature of electrode on the substrate side and the like). It should be noted that as gas for an etching, chlorine based gas which is represented by $Cl_2$, $BCl_3$, $SiCl_4$, $CCl_4$ or the like, fluorine based gas which is represented by $CF_4$, $SF_6$, $NF_3$ or the like or $O_2$ can be appropriately used.

Under the first conditions given above, the edges of the films can be tapered owing to the shape of the resist mask and the effect of the bias voltage applied to the substrate side. The angle of the tapered portion is set to 15 to 45°. In order to etch the films without leaving any residue on the gate insulating film, the etching time is prolonged by about 10 to 20%. The selective ratio of the silicon oxynitride film to the W film is 2 to 4 (typically, 3), and hence the exposed surface of the silicon oxynitride film is etched by about 20 to 50 nm through the over-etching treatment. Through the first etching treatment, first shape conductive layers 110 and 111 (first conductive layers 110a and 111a and second conductive layers 110b and 111b) are formed from the first conductive film and the second conductive film. Denoted by 112 is a gate insulating film and a region of the gate insulating film which is not covered with the first shape conductive layers is etched and thinned by about 20 to 50 nm.

Figure 3D:
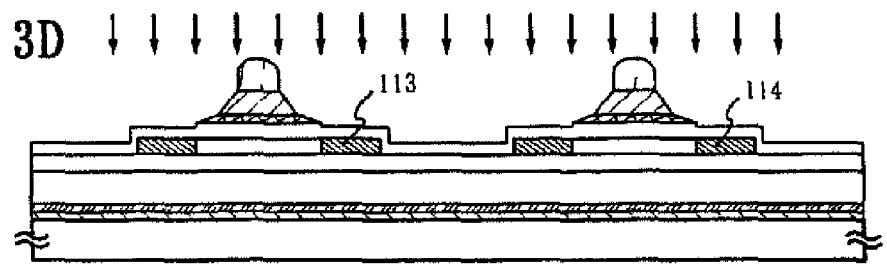

Then the first doping treatment is performed to dope the film with an n type impurity (donor) as shown in FIG. 3D. The doping is made by ion doping or ion implantation. In ion doping, the dose is set to $1\times10^{13}$ to $5\times10^{14}$ atoms/cm$^2$. Used as the impurity element for imparting the n type conductivity is a Group 5 element, typically phosphorus (P) or arsenic (As). In this case, the first shape conductive layers 110 and 111 serve as masks against the element used for the doping and the acceleration voltage is adjusted appropriately (20 to 60 keV, for example). The impurity element thus passes through the gate insulating film 112 to form impurity regions (n+ region) 113 and 114. The phosphorus (P) concentration in first impurity regions (n+ region) is set to $1\times10^{20}$ to $1\times10^{21}$ atoms/cm$^3$.

Figure 4A:
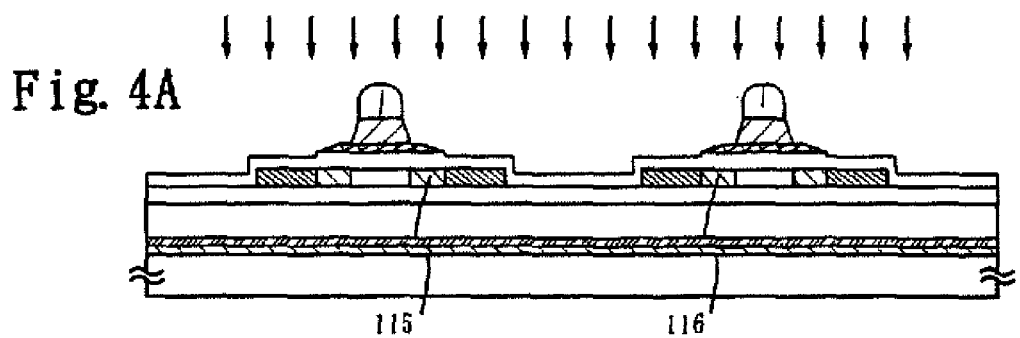
FIGS. 4A, 4B, 4C, and 4D are diagrams showing TFT fabricating steps.

Then the second doping treatment is carried out as shown in FIG. 4A. This time, the film is doped with an n-type impurity (donor) in a dose smaller than in the first doping treatment at a high acceleration voltage. For example, the acceleration voltage is set to 70 to 120 keV and the dose is set to $1\times10^{13}$ atoms/cm$^3$. As a result, impurity regions are formed inside the first impurity regions that have been formed in the island-like semiconductor films in FIG. 3D. In the second doping treatment, the second conductive films 110b and 111b are used as masks against the impurity element and the impurity element reaches regions below the first conductive films 110a and 111a. Thus formed are impurity regions (n− region) 115 and 116 that overlap the first conductive films 110a and 111a, respectively. Since the remaining first conductive layers 110a and 111a have almost the uniform thickness, the concentration difference along the first conductive layers is not large and the concentration in the impurity regions is $1\times10^{17}$ to $1\times10^{19}$ atoms/cm$^3$.

Figure 4B:
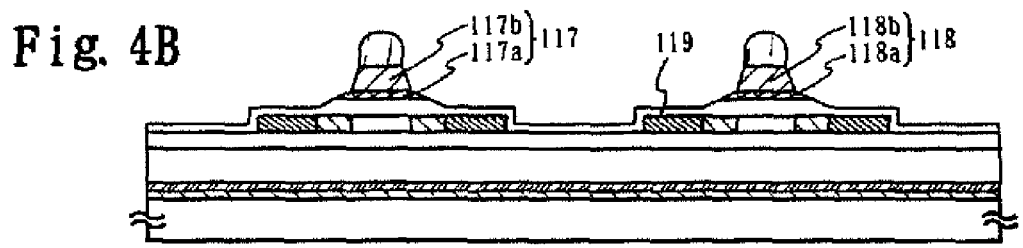

The second etching treatment is then conducted as shown in FIG. 4B. In this etching treatment, ICP etching is employed, $CF_4$ and $Cl_2$ and $O_2$ are mixed as etching gas, and plasma is generated by giving RF (13.56 MHz) power of 500 W to a coiled electrode at a pressure of 1 Pa. RF (13.56 MHz) power of 50 W is also given to the substrate side (sample stage) so that a self-bias voltage lower than that of the first etching treatment can be applied. The tungsten film is subjected to anisotropic etching under these conditions so that the tantalum nitride film or the titanium film serving as the first conductive layers is remained. In this way, second shape conductive layers 117 and 118 (first conductive films 117a and 118a and second conductive films 117b and 118b) are formed. Denoted by 119 is a gate insulating film and a region of the gate insulating film which is not covered with the second shape conductive layers 117 and 118 is further etched and thinned by about 20 to 50 nm.

Figure 4C:
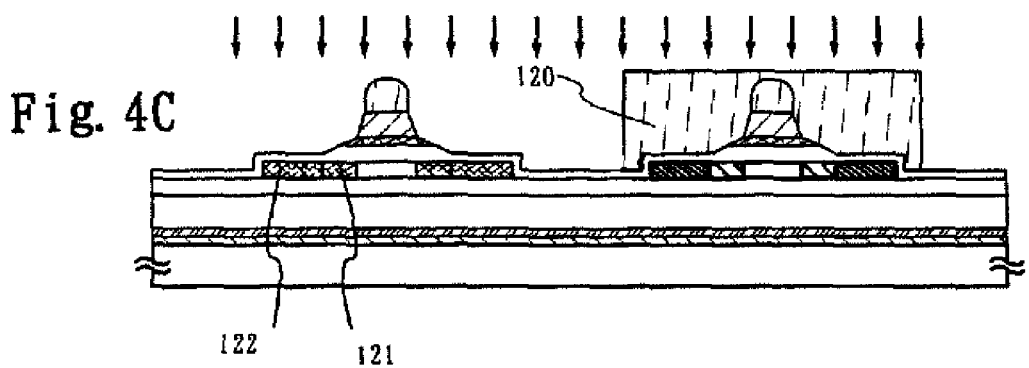

Then a resist mask 120 is formed as shown in FIG. 4C so that the island-like semiconductor layer for forming the p-channel TFT is doped with a p type impurity (acceptor). Typically, boron (B) is used. The impurity concentration in impurity regions (p+ region) 121 and 122 is set to $2\times10^{20}$ to $2\times10^{21}$ atoms/cm$^3$. Thus the regions are doped with boron in a concentration 1.5 to 3 times higher than the concentration of phosphorus that has already been contained in the regions, thereby inverting the conductive type of the regions.

Figure 4D:
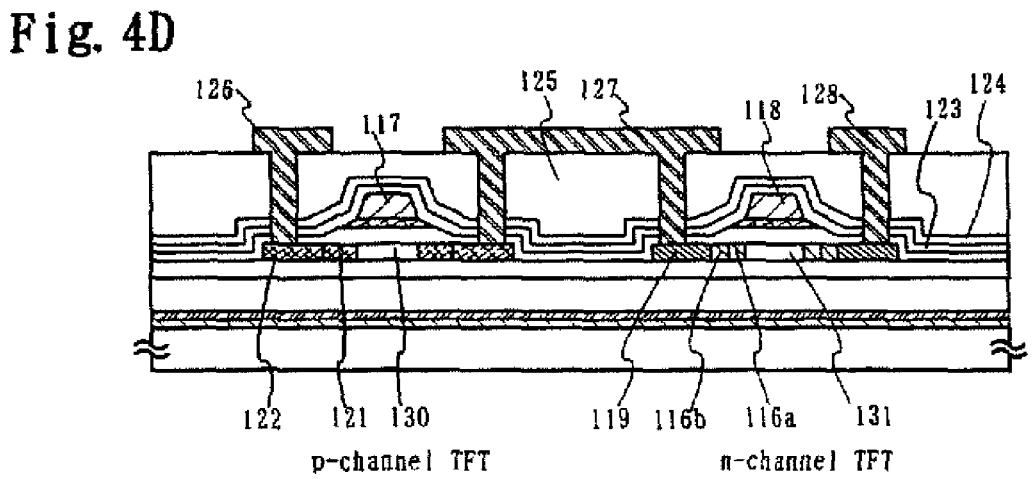

The impurity regions are formed in each semiconductor layer through the above steps. The second shape conductive layers 117 and 118 serve as gate electrodes. Thereafter, as shown in FIG. 4D, a protective insulating film 123 is formed of a silicon nitride film or a silicon oxynitride film by plasma CVD. The impurity elements that is doped the semiconductor layers are then activated for controlling the conductivity type.

A silicon nitride film 124 is formed and subjected to hydrogenation. Hydrogen is released from the silicon nitride film 124 as a result and hydrogen diffuses to the semiconductor layers. The semiconductor layers are thus hydrogenated.

An interlayer insulating film 125 is formed of an organic insulating material such as polyimide and acrylic. A silicon oxide film formed by plasma CVD using TEOS may of course be adopted instead, but it is desirable to choose the above organic insulating material from the viewpoint of improving levelness.

Contact holes are formed next, so that source or drain wirings 126 to 128 are formed from Al, Ti, Ta or the like.

In accordance with the above processes, a CMOS circuit obtained by combining an n-channel TFT and a p-channel TFT complementally is obtained A p-channel TFT has a channel formation region 130, and has the impurity regions 121 and 122 that function as source regions or drain regions.

A n-channel TFT has a channel formation region 131; an impurity region 116*a* (gate overlapped drain: GOLD region) overlapping the gate electrode 118 that is formed of the second shape conductive layer; an impurity region 116*b* (LDD region) formed outside the gate electrode; and an impurity region 119 functioning as a source region or a drain region.

The CMOS TFT as such can be used to form a part of a driver circuit of an active matrix light emitting device or an active matrix liquid crystal display device. Besides, the n-channel TFT or the p-channel TFT as above can be applied to a transistor for forming a pixel section.

Using the CMOS circuits of this embodiment in combination, a basic logic circuit or a more intricate logic circuit (such as a signal divider circuit, a D/A converter, an operation amplifier and a γ correction circuit) can be formed. It also can constitute a memory or a microprocessor.

Embodiment 2

An example of fabrication of a light emitting device having an OLED and using the TFTs obtained in accordance with Embodiment 1 will be described with reference to FIG. 5.

Figure 5:
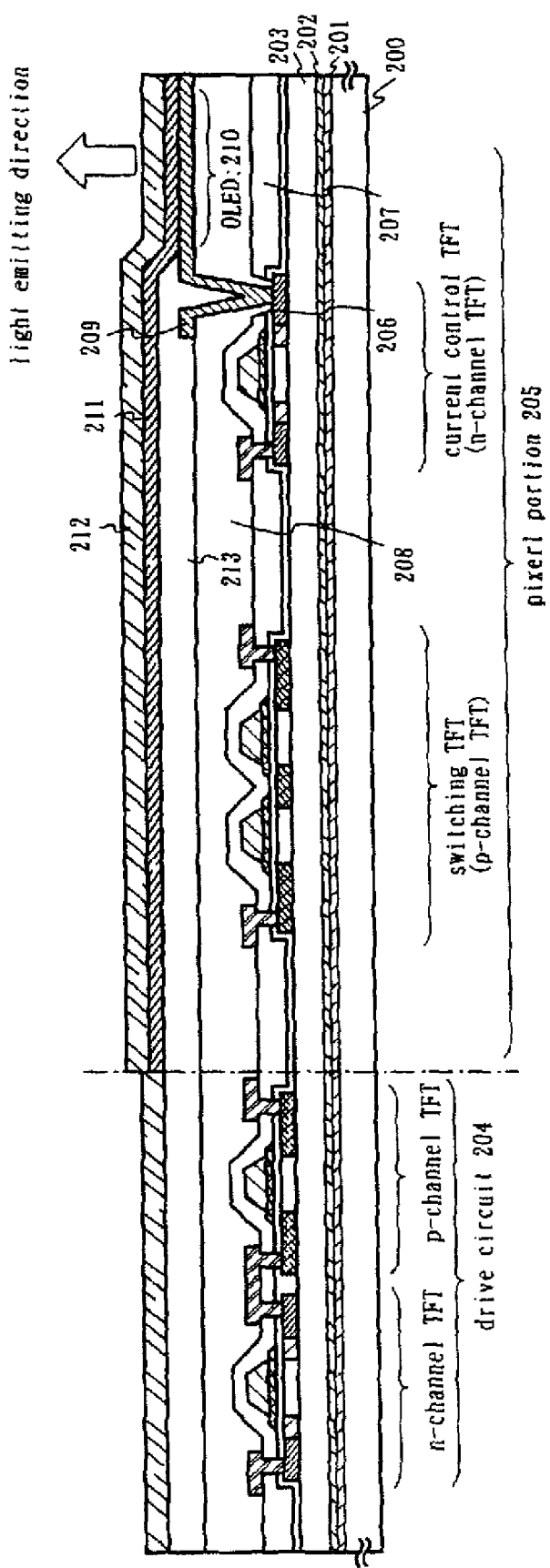
FIG. 5 is a diagram showing an active matrix board before enclosure.

FIG. 5 shows an example of a light emitting device (in a state before sealing) having a pixel portion and a drive circuit for driving the pixel portion, the pixel portion and the drive circuit being formed on one insulating member. A CMOS circuit forming a basic unit in the drive circuit and one pixel in the pixel portion are illustrated. The CMOS circuit can be obtained in accordance with Embodiment 1.

Referring to FIG. 5, a substrate 200, a nitride layer 201 and an oxide layer 202 are provided. On a base insulating layer 203 formed on the element formation substrate, the drive circuit 204 constituted of an n-channel TFT and a p-channel TFT, a switching TFT, which is a p-channel TFT, and a current control TFT, which is an n-channel TFT, are formed. In this embodiment, each of the TFTs is formed as a top gate TFT.

The n-channel TFT and p-channel TFT are the same as those in Embodiment 1. The description for them will not be repeated. The switching TFT is a p-channel TFT of a structure having two channel forming regions between a source region and a drain region (double-gate structure). In this embodiment, the structure of the switching TFT is not limited to the double-gate structure, and the switching TFT may alternatively have a single-gate structure in which only one channel forming region is formed or a triple-gate structure in which three channel forming regions are formed.

A contact hole is formed in a first interlayer insulating film 207 above the drain region 206 of the current control TFT before a second interlayer insulating film 208 is formed. This is for the purpose of simplifying the etching step when a contact hole is formed in the second interlayer insulating film 208. A contact hole is formed in the second interlayer insulating film 208 so as to reach the drain region 206, and a pixel electrode 209 connected to the drain region 206 is formed in the contact hole. The pixel electrode 209 functions as the cathode of the OLED and is formed by using a conductive film containing an element belonging to the group I or II in the periodic table. In this embodiment, a conductive film of a compound composed of lithium and aluminum is used.

An insulating film 213 is formed so as to cover an end portion of the pixel electrode 209. The insulating film 213 will be referred to as a bank in this specification. The bank 213 may be formed of an insulating film containing silicon or a resin film. If a resin film is used, carbon particles or metal particles may be added to set the specific resistance of the resin film to $1\times10^6$ to $1\times10^{12}$ Ωm (preferably $1\times10^8$ to $1\times10^{10}$ Ωm), thereby reducing the possibility of dielectric breakdown at the time of film forming.

The OLED 210 is formed by the pixel electrode (cathode) 209, an organic compound layer 211, and an anode 212. As the anode 212, a conductive film of a large work function, typically an oxide conductive film is used. As this oxide conductive film, indium oxide, tin oxide, zinc oxide or some other compound of these elements may be used.

In this specification, "organic compound layer" is defined as a generic name for a multilayer formed by combining with a light emitting layer a hole injection layer, a hole transporting layer, a hole blocking layer, an electron transporting layer, an electron injection layer, or an electron blocking layer. However, the organic compound layer may comprise a single layer of organic compound film.

The material of the light emitting layer is an organic compound material but not limited to a particular one. It may be a high-molecular weight material or a low-molecular weight material. For example, a thin film formed of a light emitting material capable of emitting light by duplet excitation or a thin film formed of a light emitting material capable of emitting light by triplet excitation may be used as the light emitting layer.

It is effective to form a passivation film (not shown) so as to completely cover the OLED 210 after the formation of the anode 212. A film having thermal conductivity, e.g., film of aluminum nitride, aluminum nitroxide, or beryllium oxide is suitably used as the passivation film. Also, an insulating film comprising a diamondlike carbon (DLC) film, a silicon nitride film or a silicon nitroxide film, or a multilayer formed of a combination of such films may be used as the passivation film.

To protect the OLED 210, steps including a step for attaching a supporting member as described above with respect to the embodiment mode and a sealing (enclosing) step are performed. Thereafter, the substrate 200 on which the nitride layer 201 is formed is stripped off. An example of the light emitting device after this step will be described with reference to FIGS. 6A and 6B. The transfer member 22 in FIG. 2D corresponds to a film substrate 600.

Figure 6A:
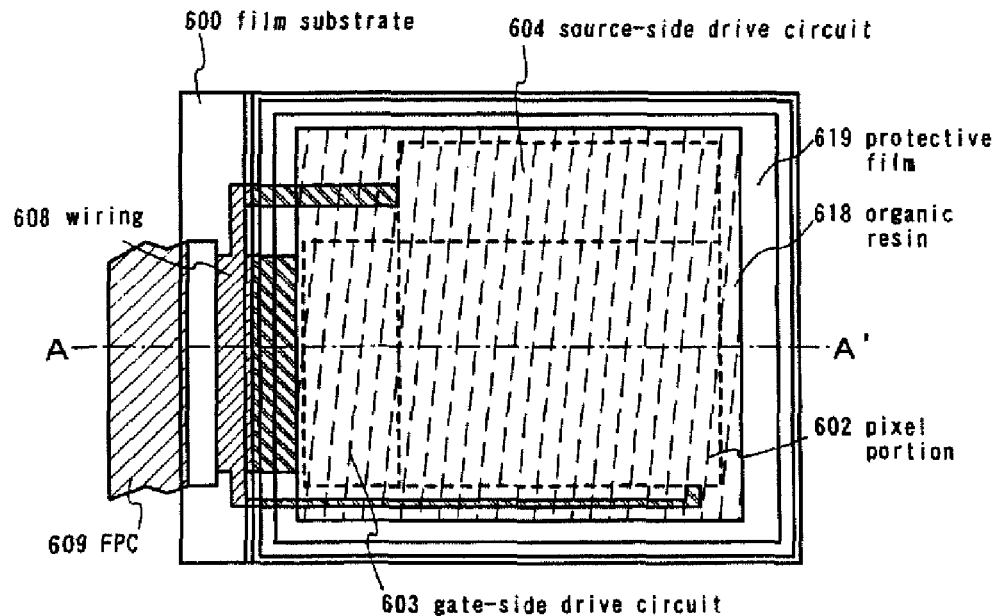
FIGS. 6A and 6B are an external view and a cross-sectional view, respectively, of an EL module.
Figure 6B:
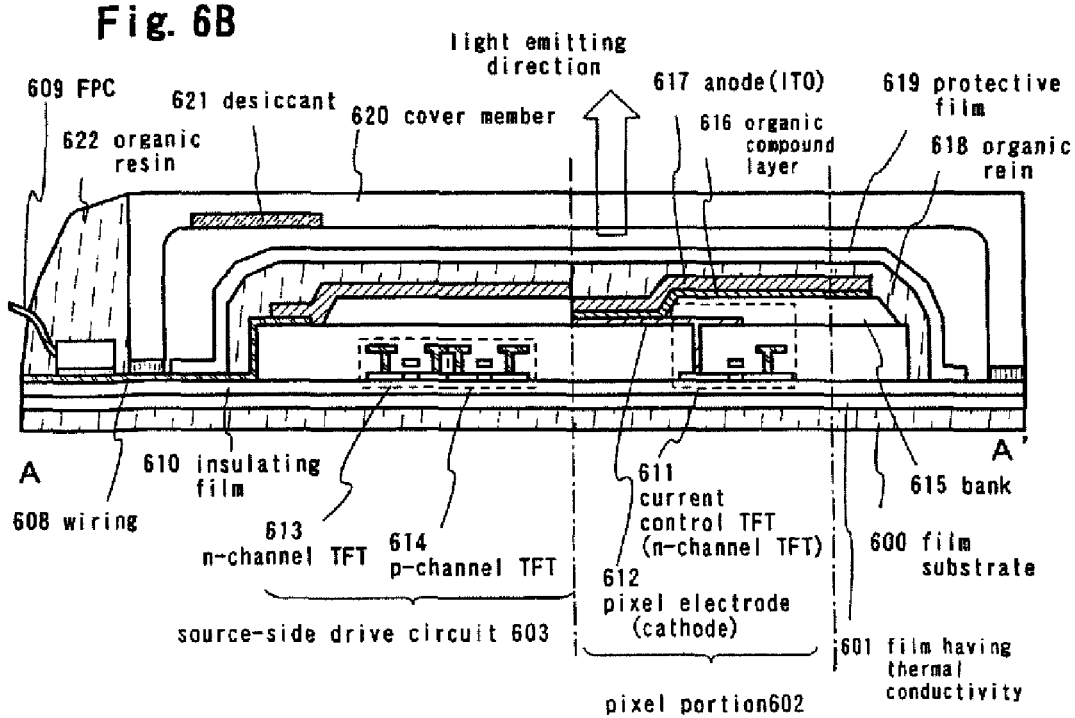

FIG. 6A is a top view of an EL module, and FIG. 6B is a cross-sectional view taken along the line A-A' of FIG. 6A. Referring to FIG. 6A, a film 601 having thermal conductivity (e.g., aluminum nitride film) is formed on the flexible film substrate 600 (e.g., a plastic substrate), and a pixel portion 602, a source-side drive circuit 604, and a gate-side drive circuit 603 are formed on the film 601. The pixel portion and the drive circuits can be obtained in the same manner as those described above with respect to Embodiments 1 and 2.

An organic resin 618 and a protective film 619 are provided. The pixel portion and the drive circuit portions are covered with the organic resin 618 and the surface of the organic resin 618 is covered with the protective film 619. These portions are enclosed with a cover member 620 using an adhesive. The cover member 620 is bonded as a supporting member before debonding of the element layer. It is desirable that a member made of the same material as the film substrate 600, e.g., a plastic substrate be used as the cover member 620, such that the cover member 620 is prevented from being deformed by heat or external force. For example, a member which is worked so as to form a cavity (having a depth of 3 to 10 μm) as shown in FIG. 6B is used. It is also desirable that the cover member be further worked to form a recess (having a depth of 50 to 200 μm) capable of accommodating a desiccant 621. If the EL module is manufactured on a gang board, the gang board may be cut after bonding between the substrate and the cover member. The gang board is cut with a $CO_2$ laser or the like so that end surfaces are aligned.

Wiring 608 is provided for transmission of signals input to the source-side drive circuit 604 and the gate-side drive circuit 603. A video signal and a clock signal from a flexible printed circuit (FPC) 609 provided as an external input terminal are received through the wiring 608. Although only the FPC is illustrated, a printed wiring board (PWB) may be attached to the FPC. The light emitting device described in this specification comprises an arrangement including not only the light emitting device main unit but also the FPC or PWB in the attached state.

The structure of the light emitting device as seen in a cross section will next be described with reference to FIG. 6B. The film 601 having thermal conductivity is formed on the film substrate 600, the insulating film 610 is formed on the film 601, and the pixel portion 602 and the gate-side drive circuit 603 are formed above the insulating film 610. The pixel portion 602 is formed by a plurality of pixels including a current control TFT 611 and a pixel electrode 612 electrically connected to the drain of the current control TFT 611. The gate-side drive circuit 603 is formed by using a CMOS circuit having a combination of an n-channel TET 613 and a p-channel TFT 614.

These TFTs (611, 613, 614, etc.) may be fabricated in the same manner as the n-channel TFT of Embodiment 1 and the p-channel TFT of Embodiment 1.

After the pixel portion 602, the source-side drive circuit 604 and the gate-side drive circuit 603 have been formed on one substrate in accordance with Embodiments 1 and 2, the supporting member (cover member in this embodiment) is bonded, the substrate (not shown) is debonded, the film 601 (e.g., aluminum nitride film) having thermal conductivity is formed on the insulating film 610, and the film substrate 600 is thereafter adhered, as shown in FIG. 1C and FIG. 2A to 2C. A bonding layer, which is not shown, is provided between the film 601 having thermal conductivity and the film substrate 600 to bond these films to each other.

In the case where the cover member 620 is formed so as to have a cavity as shown in FIG. 6B, no portion of the supporting member exists adjacent to the insulating film 610 in the portion (connection portion) corresponding to the wiring lead-out terminal at the time of debonding of the element layer after bonding of the cover member 620 provided as the supporting member, so that the mechanical strength of this portion is low. Therefore, it is desirable that the FPC 609 be attached before debonding and fixed by an organic resin 622.

In addition, as the insulating film provided between the TFT and the OLED, a material which not only blocks diffusion of an impurity ion such as an alkali metal ion, an alkali earth metal ion, but also aggressively adsorbs the impurity ion such as an alkali metal ion and an alkali earth metal ion may be preferable. Furthermore, a material which resists the temperature in the following process may be more preferable. One example of the material suitable for these conditions includes a silicon nitride film containing fluorine in a large amount. The concentration of the fluorine contained in the silicon nitride film may be $1 \times 10^{19}/cm^3$ or more, and preferably, the composition ratio of the fluorine in the silicon nitride film may be 1 to 5%. The fluorine in the silicon nitride film binds to an alkali metal ion, an alkali earth metal ion, or the like, which is adsorbed in the silicon nitride film. Another example includes an organic resin film containing particles consisting of an antimony (Sb) compound, a tin (Sn) compound, or an indium (In) compound, which adsorbs an alkali metal ion, an alkali earth metal ion, or the like, e.g. an organic resin film including particles of antimony pentoxide ($Sb_2O_5 \cdot nH_2O$). This organic resin film includes particles with an average particle diameter of 10 to 20 nm, and the light transmittance of this film is very high. The antimony compounds represented by the particles of antimony pentoxide can easily adsorb the impurity ion such as an alkali metal ion, and alkali earth metal ion.

The pixel electrode 612 functions as the cathode of the light emitting device (OLED). Banks 615 are formed at opposite ends of the pixel electrode 612, and an organic compound layer 616 and an anode 617 of the light emitting element are formed on the pixel electrode 612.

The organic compound layer 616 (for emission of light and movement of carriers for causing emission of light) may be formed by freely selecting a combination of a light emitting layer and a charge transporting layer or a charge injection layer. For example, a low-molecular weight organic compound material or a high-molecular weight organic compound material may be used to form the organic compound layer 616. Also, a thin film formed of a light emitting material (singlet compound) capable of emission of light (fluorescence) by singlet excitation or a thin film formed of a light emitting material (triplet compound) capable of emission of light (phosphorescence) by triplet excitation may be used as the organic compound layer 616. An inorganic material such as silicon carbide may be used as a charge transporting layer or a charge injection layer. These organic and inorganic materials may be selected from well-known materials.

The anode 617 also functions as a common wiring element connected to all the pixels and is electrically connected to the FPC 609 via connection wiring 608. All the elements included in the pixel portion 602 and the gate-side drive circuit 603 are covered with the anode 617, the organic resin 618 and the protective film 619.

It is preferred that a material higher in transparency or translucency to visible light be used as the organic resin 618. Also, it is desirable that a material higher in ability to limit permeation of water and oxygen be used as the organic resin 618.

Also, it is preferred that after the light emitting element has been completely covered with the organic resin 618, the protective film 619 be at least formed on the surface (exposed surface) of the organic resin 618 as shown in FIGS. 6A and 6B. The protective film may be formed on the entire surface including the back surface of the substrate. In such a case, it is necessary to carefully form the protective film so that no protective film portion is formed at the position where the external input terminal (FPC) is provided. A mask may be used to prevent film forming of the protective film at this position. The external input terminal portion may be covered with a tape such as a tape made of Teflon (registered trademark) used as a masking tape in a CVD apparatus to prevent film forming of the protective film. A film having thermal conductivity like the film 601 may be used as the protective film 619.

The light emitting element constructed as described above is enclosed with the film 601 having thermal conductivity and the protective film 619 to completely isolate the light emitting element from the outside, thus preventing materials such as water and oxygen which accelerate degradation of the organic compound layer by oxidation from entering from the outside. Also, the film having thermal conductivity enables dissipation of produced heat. Thus, the light emitting device having improved reliability is obtained.

Another arrangement is conceivable in which a pixel electrode is used as an anode and an organic compound layer and a cathode are formed in combination to emit light in a direction opposite to the direction indicated in FIG. 6B. FIG. 7 shows an example of such an arrangement. This arrangement can be illustrated in the same top view as FIG. 6A and will therefore be described with reference to a cross-sectional view only.

The structure shown in the cross-sectional view of FIG. 7 will be described. An insulating film 710 is formed on a film substrate 700, and a pixel portion 702 and a gate-side drive circuit 703 are formed over the insulating film 710. The pixel portion 702 is formed by a plurality of pixels including a current control TFT 711 and a pixel electrode 712 electrically connected to the drain of the current control TFT 711. After the layer to be debonded, which is formed on a substrate in accordance with the above-described embodiment mode of the present invention, has been debonded, a film 701 having thermal conductivity is formed on the surface of the layer to be debonded. Further, the film substrate 700 is adhered to the layer 701 having thermal conductivity. A bonding layer, which is not shown, is provided between the film 701 having thermal conductivity and the film substrate 700 to bond these films to each other. A gate-side drive circuit 703 is formed by using a CMOS circuit having a combination of an n-channel TET 713 and a p-channel TFT 714.

These TFTs (711, 713, 714, etc.) may be fabricated in the same manner as the n-channel TFT 201 of Embodiment 1 and the p-channel TFT 202 of Embodiment 1.

The pixel electrode 712 functions as an anode of the light emitting device (OLED). Banks 715 are formed at opposite ends of the pixel electrode 712, and an organic compound layer 716 and a cathode 717 of the light emitting element are formed over the pixel electrode 712.

The cathode 717 also functions as a common wiring element connected to all the pixels and is electrically connected to a FPC 709 via connection wiring 708. All the elements included in the pixel portion 702 and the gate-side drive circuit 703 are covered with the cathode 717, an organic resin 718 and a protective film 719. A cover member 720 is bonded to the element layer by an adhesive. A recess is formed in the cover member and a desiccant 721 is set therein.

In the case where the cover member 720 is formed so as to have a cavity as shown in FIG. 7, no portion of the supporting member exists adjacent to the insulating film 710 in the portion corresponding to the wiring lead-out terminal at the time of debonding of the element layer after bonding of the cover member 720 provided as the supporting member, so that the mechanical strength of this portion is low. Therefore, it is desirable that the FPC 709 be attached before debonding and fixed by an organic resin 722.

In the arrangement shown in FIG. 7, the pixel electrode is used as the anode while the organic compound layer and the cathode are formed in combination, so that light is emitted in the direction of the arrow in FIG. 7.

While the top gate TFTs have been described by way of example, the present invention can be applied irrespective of the TFT structure. For example, the present invention can be applied to bottom gate (inverted staggered structure) TFTs and staggered structure TFTs.

Embodiment 3

While an example of use of the top gate TFT in Embodiment 2 has been described, a bottom gate TFT can also be used. An example of an arrangement using a bottom gate TFT will be described with reference to FIG. 8.

As shown in FIG. 8, each of an n-channel TFT 913, a p-channel TFT 914, and an n-channel TFT 911 is of the bottom gate structure. The TFTs in the bottom gate structure may be fabricated by using well-known techniques. The active layer of these TFTs may be a semiconductor film having a crystalline structure (e.g., polysilicon) or a semiconductor film having an amorphous structure (e.g., amorphous silicon).

In FIG. 8 are illustrated a flexible film substrate 900 (e.g., a plastic substrate), a film 901 having thermal conductivity (e.g., aluminum nitride film), a pixel portion 902, a gate-side drive circuit 903, an insulating film 910, a pixel electrode (cathode) 912, a bank 915, an organic compound layer 916, an anode 917, an organic resin 918, a protective film 919, a cover member 920, a desiccant 921, and an organic resin 922. A bonding layer, which is not shown, is provided between the film 901 having thermal conductivity and the film substrate 900 to bond these films to each other.

The arrangement is the same as that of Embodiment 3 except for the n-channel TFT 913, the p-channel TFT 914 and the n-channel TFT 911. The description of the same details will not be repeated.

Embodiment 4

In this embodiment, when an organic compound layer is formed by an ink jet method, the organic compound layer is continuously formed through a plurality of pixels. More specifically, an example of formation in which the organic compound layer is formed in a stripe form on each of columns or rows of pixel electrodes arranged in correspondence with a matrix with m rows and n columns will be described. Also, the organic compound layer is formed in an oblong or rectangular shape in correspondence with each pixel electrode.

Figure 9A:
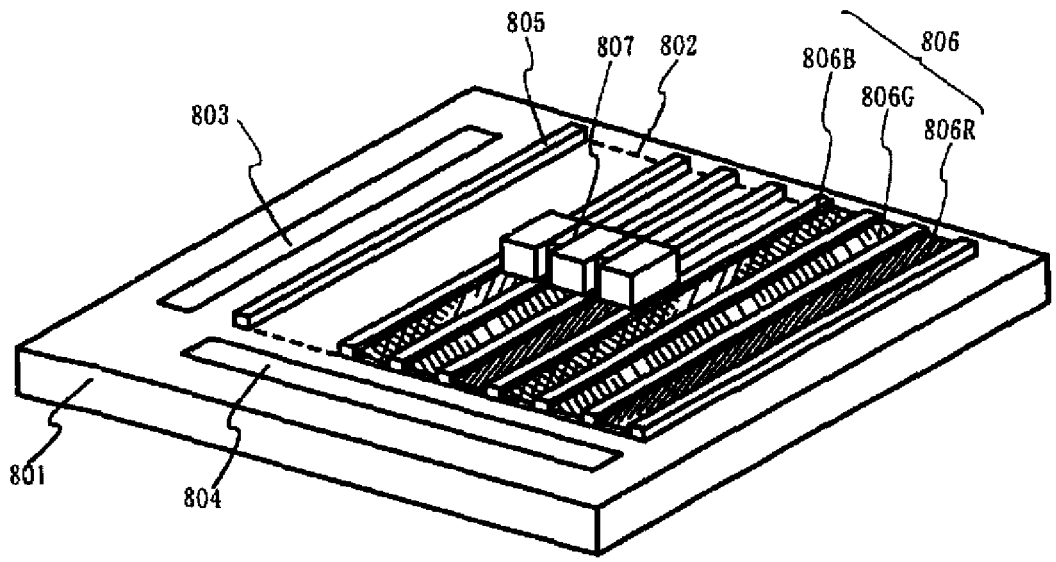
FIGS. 9A, 9B, and 9C are diagrams showing a method of forming an organic compound layer.
Figure 9B:
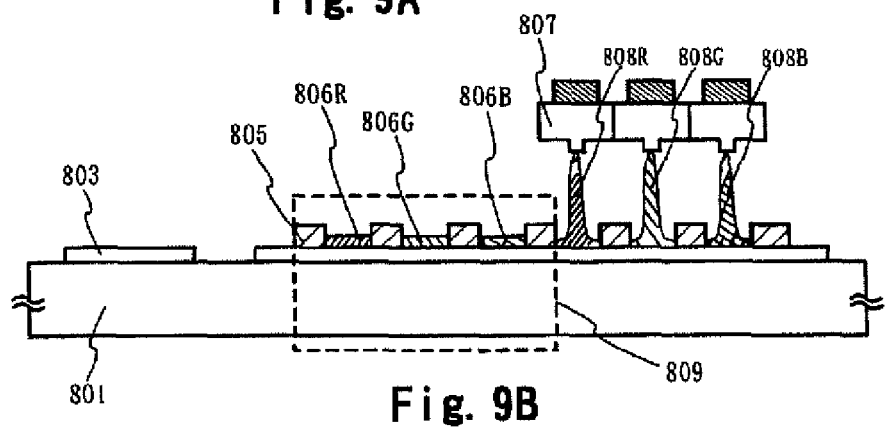
Figure 9C:
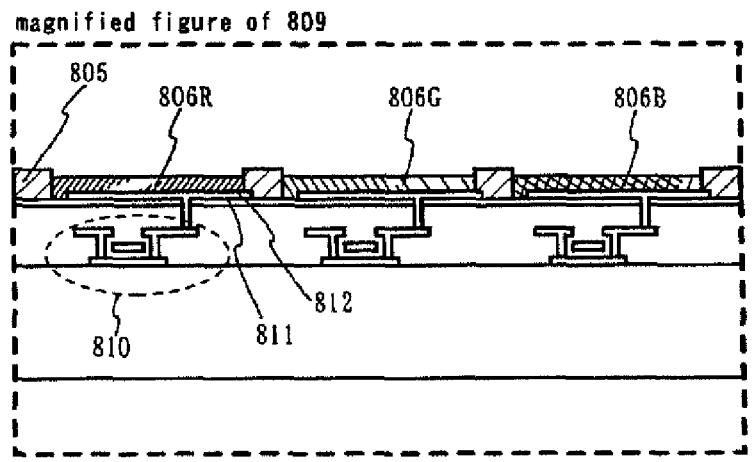

FIGS. 9A, 9B, and 9C are diagrams illustrating this embodiment. FIG. 9A shows an arrangement in which a pixel portion 802, a scanning-line-side drive circuit 803 and a data-line-side drive circuit 804 are provided on a substrate 801. A separation layer 805 is provided in the form of lands in a striped pattern in the pixel portion 802, and the organic compound layer is formed between each adjacent pair of the separation layer lands. The separation layer 805 is provided for the purpose of preventing each adjacent pair of the organic compound layer portions from mixing when the organic compound layer is formed by an ink jet method.

The organic compound layer 806 is formed by jetting from an ink head 807 a solution containing an organic compound material. The material of the organic compound layer is not limited to a particular one. However, if a multicolor is performed, organic compound layers 806R, 806G, and 806B may be provided in correspondence with red, green and blue.

FIG. 9B is a cross-sectional view of the structure schematically shown in FIG. 9A, showing a state in which the scanning-line-side drive circuit 803 and the pixel portion 802 are formed on the substrate 801. The lands of separation layer 805 are formed in the pixel portion 802, and organic compound layers 806R, 806G, and 806B are formed between the separation layer lands. The ink head 807 is of an ink jet type. Ink droplets 808R, 808G, and 808B corresponding to the colors, red, green and blue are jetted from the ink head 807 according to a control signal. The jetted ink droplets 808R, 808G, and 808B are attached to the surface of the substrate and undergo drying and baking steps. Thereafter, the jetted materials function as the organic compound layers. The ink head may be moved in one direction for scanning along each column or row, so that the processing time required to form the organic compound layers can be reduced.

FIG. 9C is a diagram showing the pixel portion in more detail. Current control TFTs 810 and pixel electrodes 812 connected to the current control TFTs 810 are formed on the substrate, and the organic compound layers 806R, 806C, and 806B are formed between the lands of the separation layer 805 on the pixel electrodes. It is desirable that an insulating film 811 having an alkali metal blocking effect be formed between the pixel electrodes 812 and the current control TFTs 810.

This embodiment can be applied as the method of forming the organic compound layer in one of the embodiment mode, Embodiment 2 and Embodiment 3.

Embodiment 5

In this embodiment, the step in which an active matrix type liquid crystal display device is prepared by peeling off the substrate from the active matrix substrate prepared in Embodiment 1 and adhering it with a plastic substrate will be described below. FIG. 10 is used for the purpose of describing it.

In FIG. 10A, the reference numeral 400 denotes a substrate, the reference numeral 401 denotes a nitride layer, the reference numeral 402 denotes an oxide layer, the reference numeral 403 denotes a base insulating layer, the reference numeral 404a denotes an element of a driver circuit 413, the reference numeral 404b denotes an element 404b of the pixel section 414 and the reference numeral 405 denotes a pixel electrode. Here, the term "element" is referred to a semiconductor element (typically, TFT) or MIM element or the like used for a switching element of pixels in an active matrix type liquid crystal display device. In addition, an active layer of the switching element can be both a semiconductor having a crystal structure film (polysilicon film and the like) and a semiconductor film (amorphous silicon and the like) having an amorphous structure.

First, according to Embodiment 1, n-channel type TFT, one of which electrode is a a pixel electrode, is formed. Further, N-channel TFT and p-channel TFT are formed on the driver circuit 413 respectively on the same substrate as the substrate on which the above n-channel TFT with the pixel electrode is formed. Subsequently, after the active matrix substrate of the state in FIG. 10A was obtained, an orientation film 406a is formed on the active matrix substrate of FIG. 10A, and a rubbing processing is performed. It should be noted that in this embodiment, before the orientation film is formed, a spacer in a column shape (not shown) for retaining a substrate interval was formed at the desired position by patterning an organic resin film such as an acryl resin or the like. Moreover, instead of a spacer in a column shape, a spacer in a sphere shape may be scattered over the whole surface of the substrate.

Moreover, in this embodiment, it is preferable that films that is mainly contained Al or Ag or lamination of these films that have well reflectivity are used for forming a pixel electrode, but when the pixel electrode is formed by a transparent conductive film, although the number of photo-masks increases by one sheet, a transparent type display device can be formed.

Subsequently, an opposing substrate which is to be a supporting member 407 is prepared for. A color filter (not shown) in which a colored layer and a shielding layer were arranged corresponding to the respective pixels has been provided on this opposing substrate. Moreover, a shielding layer was provided on the portion of the driver circuit. A flattening film (not shown) for covering this color filter and the shielding layer was provided. Subsequently, an opposing electrode 408 consisted of a transparent conductive film was formed on the flattening film in the pixel section, an orientation film 406b was formed on the whole surface of the opposing substrate, and the rubbing processing was provided.

Then, an active matrix substrate 400 in which the pixel section and the driver circuit were formed and the supporting member 407 are adhered together with a sealing medium which is to be an adhesive layer 409. Into a sealing medium, filler is mixed, two sheets of substrates are adhered together with uniform interval by this filler and a spacer in a column shape. Then, between both substrates, a liquid crystal material 410 is implanted and completely sealed with a sealing compound (not shown) (FIG. 10B). As the liquid crystal material 410, the known liquid crystal material may be used.

Next, the substrate 400 provided a nitride layer or a metal layer 401 is peeled off by physical means. (FIG. 10C) The substrate 400 can be peeled off by comparatively small power, because the membrane stress of the oxide layer 402 is different from that of the nitride layer 401.

The film 415 having the heat conductivity is formed on the face that is peeled off. (FIG. 11A) The film 415 having the heat conductivity can repair a crack due to peeling. As the film 415 having the heat conductivity, a nitride aluminum (AlN), an oxynitride aluminum (AlNO), and an oxynitride beryllium oxide (BeO) can be used. Further, it is preferable for the film 415 having the heat conductivity to be transparent film or a translucent film as against visible light. In this embodiment, the nitride aluminum (AlN) having 2.85 W/cm·K extremely high heat conductivity rate and 6.28 eV (RT) energy gap is formed by sputtering.

Subsequently, the film 415 having the heat conductivity is adhered with an adhesive layer 411 consisted of an epoxy resin or the like on a transfer member 412. In this embodiment, the transfer member 412 can be made light by using plastic film substrate. In this way, a flexible liquid crystal module is completed. The liquid crystal module can prevent an element from deterioration by emitting the generation of heat occurred by elements 404a to 404c by using the film 415 having the heat conductivity. The film 415 having the heat conductivity can prevent transformation and a change in quality of a transfer member that is weak to heat. Then, if necessary, the flexible substrate 412 or an opposing substrate is cut down in the desired shape. Furthermore, a polarizing plate (not shown) or the like was appropriately provided using the known technology. Then, a FPC (not shown) was attached using the known technology. At the time of debonding of the element layer after bonding of the cover member 620 provided as the supporting member, so that the mechanical strength of this portion is low. Therefore, it is desirable that the FPC 609 be attached before debonding and fixed by an organic resin 622. In addition, after that the substrate is peeled off, the opposite substrate is bonded, the wiring drawing portion (a connecting portion) become only peeled off layer so that the mechanical strength become weak. Thus, it is preferable that the peeled off layer is adhered over with FPC before peeling off and fixed with organic resin.

Embodiment 6

An example of a reflection type of display device in which the pixel electrode is formed of a metallic material having a reflecting property has been described as Embodiment 5. This embodiment is an example of a half-transmission type of display device in which pixel electrodes are formed of an conductive film having a light-transmitting property and a metallic material having a reflecting property, as shown in FIG. 12.

The step of forming the interlayer insulating layer covering the TFTs and the steps performed before this step are the same as those in Embodiment 5, and the description for them will not be repeated. One of two electrodes in contact with the source region or the drain region of a TFT is formed of a metallic material having a reflecting property to form a pixel electrode (reflecting portion) 502. Subsequently, a pixel electrode (transmitting portion) 501 made of a conductive film having a light-transmitting property is formed so as to overlap the pixel electrode (reflecting portion) 502. As the conductive film having a light-transmitting property, indium-tin oxide (ITO), indium-zinc oxide ($In_2O_2$—ZnO) or zinc oxide (ZnO), for example, may be used.

An active matrix board is formed in the above-described manner. The substrate is stripped off from this active matrix board in accordance with the embodiment mode. A film 507 having thermal conductivity is thereafter formed, a plastic substrate is bonded to the board by an adhesive, and a liquid crystal module is made in accordance with Embodiment 5. A backlight 504 and a light guide plate 505 are provided on the obtained liquid crystal module. The liquid crystal module is thereafter covered with a cover 506. An active-matrix liquid crystal display device such as that partially shown in section in FIG. 12 is thereby completed. The cover and the liquid crystal module are bonded to each other by using an adhesive and an organic resin. When the plastic substrate and the opposed substrate are bonded to each other, a space between the opposed substrate and a frame placed so as to surround the opposed substrate may be filled with the organic resin for bonding. Since the display device is of a half-transmission type, polarizing plates 503 are adhered to both the plastic substrate and the opposed substrate.

When a sufficient quantity of external light is supplied, the display device is driven as a reflection type in such a manner that while the backlight is maintained in the off state, display is performed by controlling the liquid crystal between the counter electrode provided on the opposed substrate and the pixel electrodes (reflecting portions) 502. When the quantity of external light is insufficient, the backlight is turned on and display is performed by controlling the liquid crystal between the counter electrode provided on the opposed substrate and the pixel electrodes (transmitting portions) 501.

However, if the liquid crystal used is a TN liquid crystal or an STN liquid crystal, the twist angle of the liquid crystal is changed between the reflection type and the transmission type. Therefore, there is a need to optimize the polarizing plate and the phase difference plate. For example, a need arises to separately provide an optical rotation compensation mechanism for adjusting the twist angle of the liquid crystal (e.g., a polarizing plate using a high-molecular weight liquid crystal).

Embodiment 7

Various modules (active matrix liquid crystal module, active matrix EL module and active matrix EC module) can be completed by the present invention. Namely, all of the electronic equipments are completed by implementing the present invention.

Following can be given as such electronic equipments: video cameras; digital cameras; head mounted displays (goggle type displays); car navigation systems; projectors; car stereos; personal computers; portable information terminals (mobile computers, mobile phones or electronic books etc.) etc. Examples of these are shown in FIGS. 13 and 14.

FIG. 13A is a personal computer which comprises: a main body 2001; an image input section 2002; a display section 2003; and a keyboard 2004 etc.

FIG. 13B is a video camera which comprises: a main body 2101; a display section 2102; a voice input section 2103; operation switches 2104; a battery 2105 and an image receiving section 2106 etc.

FIG. 13C is a mobile computer which comprises: a main body 2201; a camera section 2202; an image receiving section 2203; operation switches 2204 and a display section 2205 etc.

FIG. 13D is a goggle type display which comprises: a main body 2301; a display section 2302; and an arm section 2303 etc.

FIG. 13E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

FIG. 13F is a digital camera which comprises: a main body 2501; a display section 2502; a view finder 2503; operation switches 2504; and an image receiving section (not shown in the figure) etc.

Figure 14A:
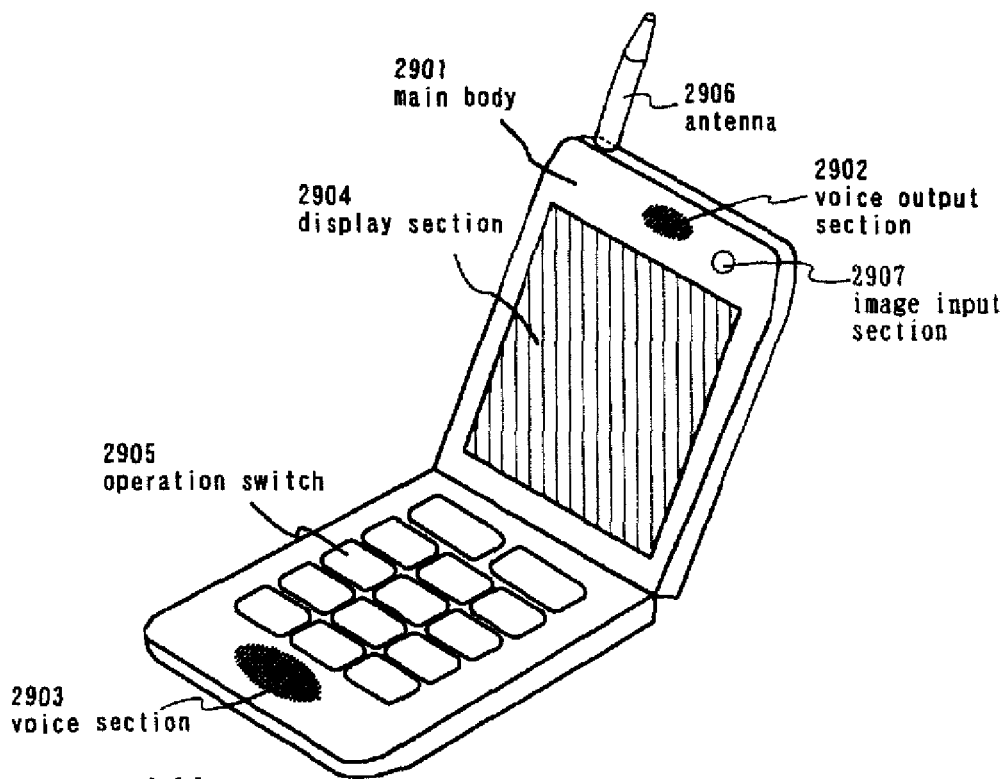
FIGS. 14A to 14C are diagrams showing examples of electronic equipment.

FIG. 14A is a mobile phone which comprises: a main body 2901; a voice output section 2902; a voice input section 2903; a display section 2904; operation switches 2905; an antenna 2906; and an image input section (CCD, image sensor, etc.) 2907 etc.

Figure 14B:
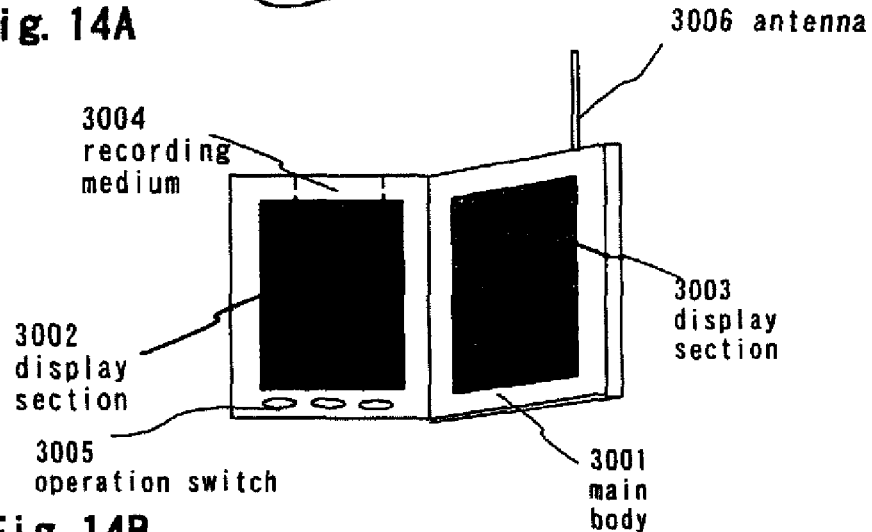

FIG. 14B is a portable book (electronic book) which comprises: a main body 3001; display sections 3002 and 3003; a recording medium 3004; operation switches 3005 and an antenna 3006 etc.

Figure 14C:
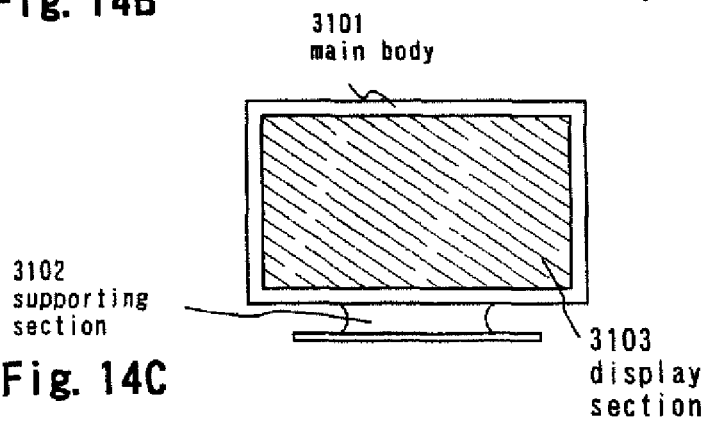

FIG. 14C is a display which comprises: a main body 3101; a supporting section 3102; and a display section 3103 etc.

In addition, the display shown in FIG. 14C has small and medium-sized or large-sized screen, for example a size of 5 to 20 inches. Further, to manufacture the display part with such sizes, it is preferable to mass-produce by gang printing by using a substrate with one meter on a side. As described above, the applicable range of the present invention is extremely large, and the invention can be applied to electronic equipments of various areas. Note that the electronic devices of this embodiment can be achieved by utilizing any combination of constitutions in Embodiments 1 to 6.

The film having thermal conductivity in accordance with the present invention dissipates heat produced by elements to limit degradation of the elements and to prevent deformation or and change in quality of a transfer member, e.g., a plastic substrate, thus protecting the elements. Also, the film having thermal conductivity in accordance with the present invention prevents mixing of impurities such as water and oxygen from the outside to protect the elements.

Even if cracks are caused in the debonded layer at the time of debonding the debonded layer from the substrate by a physical means, the cracked portions can be repaired by the film having thermal conductivity in accordance with the present invention, thus improving yield as well as the reliability of the elements.

What is claimed is:

1. A semiconductor device comprising:
a first substrate;
a first thermal conductivity film over the first substrate;
a thin film transistor over the first thermal conductivity film;
a second thermal conductivity film over the thin film transistor;
a light-emitting element disposed between the thin film transistor and the second thermal conductivity film; and
a second substrate over the second thermal conductivity film,
wherein each of the first thermal conductivity film and the second thermal conductivity film includes aluminum nitride.

2. A semiconductor device according to claim 1, further comprising an oxide layer disposed between the first thermal conductivity film and the thin film transistor.

3. A semiconductor device according to claim 1,
wherein each of the first thermal conductivity film and the second thermal conductivity film has a light-transmitting property.

4. A semiconductor device according to claim 1,
wherein the thin film transistor includes a semiconductor layer and a gate electrode,
wherein the semiconductor layer includes a first impurity region, a second impurity region, a third impurity region, and a channel formation region,
wherein the first impurity region and the second impurity region are not overlapped with the gate electrode,
wherein the third impurity region and the channel formation region are overlapped with the gate electrode, and
wherein the second impurity region and the third impurity region are disposed between the first impurity region and the channel formation region.

5. A semiconductor device according to claim 1,
wherein each of the first substrate and the second substrate is a plastic substrate.

6. A semiconductor device according to claim 1, further comprising a first bonding layer between the first substrate and the first thermal conductivity film, and a second bonding layer between the second thermal conductivity film and the second substrate.

7. A semiconductor device according to claim 6,
wherein the first bonding layer is in contact with the first substrate and the first thermal conductivity film, and
wherein the second bonding layer is in contact with the second substrate and the second thermal conductivity film.

8. A semiconductor device comprising:
a first substrate;
a first thermal conductivity film over a first bonding layer;
a thin film transistor over the first thermal conductivity film;
a second thermal conductivity film over the thin film transistor;
light-emitting element disposed between the thin film transistor and the second thermal conductivity film; and
a second substrate over the second thermal conductivity film,
wherein each of the first thermal conductivity film and the second thermal conductivity film includes aluminum oxide.

9. A semiconductor device according to claim 8, further comprising an oxide layer disposed between the first thermal conductivity film and the thin film transistor.

10. A semiconductor device according to claim 8,
wherein each of the first thermal conductivity film and the second thermal conductivity film has a light-transmitting property.

11. A semiconductor device according to claim 8,
wherein the thin film transistor includes a semiconductor layer and a gate electrode,
wherein the semiconductor layer includes a first impurity region, a second impurity region, a third impurity region, and a channel formation region,
wherein the first impurity region and the second impurity region are not overlapped with the gate electrode,
wherein the third impurity region and the channel formation region are overlapped with the gate electrode, and
wherein the second impurity region and the third impurity region are disposed between the first impurity region and the channel formation region.

12. A semiconductor device according to claim 8,
wherein each of the first substrate and the second substrate is a plastic substrate.

13. A semiconductor device according to claim 8,
wherein the first bonding layer is disposed between the first substrate and the first thermal conductivity film, and a second bonding layer is disposed between the second thermal conductivity film and the second substrate.

14. A semiconductor device according to claim 13,
wherein the first bonding layer is in contact with the first substrate and the first thermal conductivity film, and
wherein the second bonding layer is in contact with the second substrate and the second thermal conductivity film.

15. A semiconductor device comprising:
a first substrate;
a first thermal conductivity film over a first bonding layer;
a thin film transistor over the first thermal conductivity film;
a second thermal conductivity film over the thin film transistor;
a light-emitting element disposed between the thin film transistor and the second thermal conductivity film; and
a second substrate over the second thermal conductivity film,
wherein each of the first thermal conductivity film and the second thermal conductivity film includes aluminum nitride oxide.

16. A semiconductor device according to claim 15, further comprising an oxide layer disposed between the first thermal conductivity film and the thin film transistor.

17. A semiconductor device according to claim 14,
wherein each of the first thermal conductivity film and the second thermal conductivity film has a light-transmitting property.

18. A semiconductor device according to claim 14,
wherein the thin film transistor includes a semiconductor layer and a gate electrode,
wherein the semiconductor layer includes a first impurity region, a second impurity region, a third impurity region, and a channel formation region,
wherein the first impurity region and the second impurity region are not overlapped with the gate electrode,
wherein the third impurity region and the channel formation region are overlapped with the gate electrode, and
wherein the second impurity region and the third impurity region are disposed between the first impurity region and the channel formation region.

19. A semiconductor device according to claim 15,
wherein each of the first substrate and the second substrate is a plastic substrate.

20. A semiconductor device according to claim 15,
wherein the first bonding layer is disposed between the first substrate and the first thermal conductivity film, and a second bonding layer is disposed between the second thermal conductivity film and the second substrate.

21. A semiconductor device according to claim 20,
wherein the first bonding layer is in contact with the first substrate and the first thermal conductivity film, and
wherein the second bonding layer is in contact with the second substrate and the second thermal conductivity film.

22. A semiconductor device comprising:
a transfer member;
a supporting member;
a first thermal conductivity film;
a second thermal conductivity film;
a thin film transistor disposed between the transfer member and the supporting member, and disposed between the first thermal conductivity film and the second thermal conductivity film; and
a light-emitting element disposed between the thin film transistor and the supporting member,
wherein each of the first thermal conductivity film and the second thermal conductivity film includes aluminum nitride.

23. A semiconductor device according to claim 22, further comprising a first bonding layer disposed between the transfer member and the thin film transistor, and a second bonding layer disposed between the supporting member and the thin film transistor.

24. A semiconductor device according to claim 22,
wherein each of the first thermal conductivity film and the second thermal conductivity film has a light-transmitting property.

25. A semiconductor device according to claim 22,
wherein each of the first thermal conductivity film and the second thermal conductivity film includes metal.

26. A semiconductor device according to claim 22, further comprising an oxide layer disposed between the transfer member and the thin film transistor, and disposed between the first thermal conductivity film and the thin film transistor.

27. A semiconductor device according to claim 22,
wherein each of the transfer member and the supporting member includes plastic.

28. A semiconductor device comprising:
a transfer member;
a supporting member;
a first thermal conductivity film;
a second thermal conductivity film;
a thin film transistor disposed between the transfer member and the supporting member, and disposed between the first thermal conductivity film and the second thermal conductivity film; and
a light-emitting element disposed between the thin film transistor and the supporting member,
wherein each of the first thermal conductivity film and the second thermal conductivity film includes aluminum oxide.

29. A semiconductor device according to claim 28, further comprising a first bonding layer disposed between the transfer member and the thin film transistor, and a second bonding layer disposed between the supporting member and the thin film transistor.

30. A semiconductor device according to claim 28,
wherein each of the first thermal conductivity film and the second thermal conductivity film has a light-transmitting property.

31. A semiconductor device according to claim 28,
wherein each of the first thermal conductivity film and the second thermal conductivity film includes metal.

32. A semiconductor device according to claim 28, further comprising an oxide layer disposed between the transfer member and the thin film transistor, and disposed between the first thermal conductivity film and the thin film transistor.

33. A semiconductor device according to claim 28,
wherein each of the transfer member and the supporting member includes plastic.

34. A semiconductor device comprising:
a transfer member;
a supporting member;
a first thermal conductivity film;
a second thermal conductivity film;
a thin film transistor disposed between the transfer member and the supporting member, and disposed between the first thermal conductivity film and the second thermal conductivity film; and
a light-emitting element disposed between the thin film transistor and the supporting member,
wherein each of the first thermal conductivity film and the second thermal conductivity film includes aluminum nitride oxide.

35. A semiconductor device according to claim 34, further comprising a first bonding layer disposed between the transfer member and the thin film transistor, and a second bonding layer disposed between the supporting member and the thin film transistor.

36. A semiconductor device according to claim 34,
wherein each of the first thermal conductivity film and the second thermal conductivity film has a light-transmitting property.

37. A semiconductor device according to claim 34,
wherein each of the first thermal conductivity film and the second thermal conductivity film includes metal.

38. A semiconductor device according to claim 34, further comprising an oxide layer disposed between the transfer member and the thin film transistor, and disposed between the first thermal conductivity film and the thin film transistor.

39. A semiconductor device according to claim 34,
wherein each of the transfer member and the supporting member includes plastic.

40. A semiconductor device comprising:
a first substrate;
a first thermal conductivity film over the first substrate;
a thin film transistor over the first thermal conductivity film;

a second thermal conductivity film over the thin film transistor;

a liquid crystal layer disposed between the thin film transistor and the second thermal conductivity film; and a second substrate over the second thermal conductivity film, wherein each of the first thermal conductivity film and the second thermal conductivity film includes aluminum nitride.

41. A semiconductor device comprising:

a first substrate;

a first thermal conductivity film over a first bonding layer;

a thin film transistor over the first thermal conductivity film;

a second thermal conductivity film over the thin film transistor;

a liquid crystal layer disposed between the thin film transistor and the second thermal conductivity film; and a second substrate over the second thermal conductivity film, wherein each of the first thermal conductivity film and the second thermal conductivity film includes aluminum oxide.

42. A semiconductor device comprising:

a first substrate;

a first thermal conductivity film over a first bonding layer;

a thin film transistor over the first thermal conductivity film;

a second thermal conductivity film over the thin film transistor;

a liquid crystal layer disposed between the thin film transistor and the second thermal conductivity film; and a second substrate over the second thermal conductivity film, wherein each of the first thermal conductivity film and the second thermal conductivity film includes aluminum nitride oxide.

* * * * *

UNITED STATES PATENT AND TRADEMARK OFFICE
CERTIFICATE OF CORRECTION

PATENT NO. : 8,390,019 B2
APPLICATION NO. : 12/430609
DATED : March 5, 2013
INVENTOR(S) : Shunpei Yamazaki et al.

Page 1 of 1

It is certified that error appears in the above-identified patent and that said Letters Patent is hereby corrected as shown below:

In the Specification

Column 10, line 57, replace "It" with --Ir--;

Column 21, line 26, replace "806C" with --806G--;

In the Claims

Column 26, line 5, in claim 6, before "light-emitting" insert --a--;

Column 26, line 64, in claim 17, replace "14" with --15--; and

Column 27, line 1, in claim 18, replace "14" with --15--.

Signed and Sealed this
Thirteenth Day of August, 2013

Teresa Stanek Rea
*Acting Director of the United States Patent and Trademark Office*